(12) United States Patent  
Takeuchi et al.

(10) Patent No.: US 8,927,975 B2  
(45) Date of Patent: Jan. 6, 2015

(54) LIGHT EMITTING ELEMENT, METHOD FOR MANUFACTURING SAME, AND LIGHT EMITTING DEVICE

(71) Applicant: Panasonic Corporation, Osaka (JP)

(72) Inventors: Takayuki Takeuchi, Hyogo (JP); Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/719,556

(22) Filed: Dec. 19, 2012

(65) Prior Publication Data

US 2013/0134474 A1  May 30, 2013

Related U.S. Application Data

(63) Continuation of application No. PCT/JP2010/004957, filed on Aug. 6, 2010.

(51) Int. Cl.
| | |
|---|---|
| *H01L 27/32* | (2006.01) |
| *H01L 51/56* | (2006.01) |
| *H01L 33/42* | (2010.01) |
| *H01L 51/50* | (2006.01) |

(52) U.S. Cl.
CPC ............ *H01L 33/42* (2013.01); *H01L 51/5088* (2013.01); *H01L 27/3246* (2013.01); *H01L 27/3283* (2013.01); *H01L 2251/5323* (2013.01)
USPC ......................................................... 257/40

(58) Field of Classification Search
CPC ....................................................... H01I 33/08
IPC ................................................... H01L 27/3246
See application file for complete search history.

(56) References Cited

U.S. PATENT DOCUMENTS

| 5,294,869 A | 3/1994 | Tang et al. |
| 5,443,922 A | 8/1995 | Nishizaki et al. |
| 5,688,551 A | 11/1997 | Littman et al. |
| 6,132,280 A | 10/2000 | Tanabe et al. |

(Continued)

FOREIGN PATENT DOCUMENTS

| CN | 1612657 | 5/2005 |
| EP | 2175504 | 4/2010 |

(Continued)

OTHER PUBLICATIONS

China Office Action in Chinese Patent Application No. 201080001855.6, dated Jul. 17, 2012.

(Continued)

*Primary Examiner* — Fernando L Toledo
*Assistant Examiner* — Valerie N Newton
(74) *Attorney, Agent, or Firm* — Greenblum & Bernstein, P.L.C.

(57) ABSTRACT

Organic light-emitting elements each have the following structure: a transparent anode, a functional layer including a charge injection layer and an organic light-emitting layer, and a transparent cathode are layered on a substrate in the stated order; a bank defines a formation area of the organic light-emitting layer; the charge injection layer is a metal oxide layer formed by oxidizing an upper surface portion of the anode composed of the metal layer, and a portion of the charge injection layer that is positioned under the area is depressed so as to form a recess; and the upper peripheral edge of the recess is covered with a covering portion of the bank.

15 Claims, 16 Drawing Sheets

(56) References Cited

U.S. PATENT DOCUMENTS

| | | |
|---|---|---|
| 6,284,393 B1 | 9/2001 | Hosokawa et al. |
| 6,309,801 B1 | 10/2001 | Meijer et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0093434 A1 | 5/2005 | Suh et al. |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0204788 A1 | 9/2006 | Yoshikawa |
| 2006/0232200 A1 | 10/2006 | Ookawa et al. |
| 2006/0243377 A1 | 11/2006 | Matsuo et al. |
| 2006/0251922 A1 | 11/2006 | Liao et al. |
| 2006/0284166 A1 | 12/2006 | Chua et al. |
| 2007/0029929 A1 | 2/2007 | Nakamura et al. |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0007162 A1 | 1/2008 | Ookawa et al. |
| 2008/0150422 A1 | 6/2008 | Ohara |
| 2008/0231179 A1 | 9/2008 | Abe et al. |
| 2009/0115318 A1 | 5/2009 | Gregory et al. |
| 2009/0160325 A1 | 6/2009 | Yatsunami et al. |
| 2009/0212689 A1 | 8/2009 | Lee et al. |
| 2009/0243478 A1 | 10/2009 | Shoda et al. |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2010/0102310 A1 | 4/2010 | Komatsu et al. |
| 2010/0181554 A1 | 7/2010 | Yoshida et al. |
| 2010/0258833 A1 | 10/2010 | Okumoto et al. |
| 2010/0302221 A1 | 12/2010 | Okumoto |
| 2011/0018007 A1 | 1/2011 | Kasahara et al. |
| 2011/0037068 A1 | 2/2011 | Yamazaki et al. |
| 2011/0042703 A1 | 2/2011 | Okumoto et al. |
| 2011/0193107 A1* | 8/2011 | Takeuchi et al. ............ 257/88 |
| 2011/0291086 A1* | 12/2011 | Nishiyama .................. 257/40 |
| 2012/0061656 A1 | 3/2012 | Ohuchi et al. |
| 2012/0178191 A1 | 7/2012 | Sakanoue et al. |

FOREIGN PATENT DOCUMENTS

| | | |
|---|---|---|
| EP | 2219420 | 8/2010 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-208339 | 8/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-286664 | 10/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 4659141 | 3/2011 |
| WO | 2004/100282 | 11/2004 |
| WO | 2008/120714 A1 | 10/2008 |
| WO | 2008/149498 A1 | 12/2008 |
| WO | 2008/149499 A1 | 12/2008 |
| WO | 2009/069476 | 6/2009 |
| WO | 2009/107323 | 9/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | WO 2010092796 A1 * | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

U.S. Appl. No. 13/088,654 to Takayuki Takeuchi et al., filed Apr. 18, 2011.

U.S. Appl. No. 13/091,652 to Hideaki Matsushima, filed Apr. 21, 2011.

U.S. Appl. No. 13/082,674 to Hideaki Matsushima, filed Apr. 8, 2011.

U.S. Appl. No. 13/091,667 to Hideaki Matsushima, filed Apr. 21, 2011.

International Search Report in PCT/JP2010/000785, mailing date of Mar. 23, 2010.

U.S. Appl. No. 13/746,481 to Seiji Nishiyama, filed Jan. 22, 2013.

U.S. Appl. No. 13/739,384 to Takayuki Takeuchi et al., filed Jan. 11, 2013.

U.S. Appl. No. 13/721,202 to Kenji Harada et al., filed Dec. 20, 2012.

International Search Report in PCT/JP2010/004986, dated Aug. 31, 2010.

(56) References Cited

OTHER PUBLICATIONS

International Search Report in PCT/JP2010/004963, dated Sep. 7, 2010.
International Search Report in PCT/JP2010/004957, dated Aug. 31, 2010.
International Search Report in PCT/JP2010/004956, dated Sep. 7, 2010.
Extended European Search Report (EESR) in European Patent Application No. 10811391.1, dated Feb. 27, 2013.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
Meyer et al., "Charge generation layers comprising transition metal-oxide/organic interfaces: Electronic structure and charge generation mechanism", Applied Physics Letters, 96, 193302, pp. 1-3 (May 2010).
United States Office Action in U.S. Appl. No. 13/746,481, dated Apr. 29, 2014.
United States Office Action in U.S. Appl. No. 13/739,384, dated Mar. 14, 2014.
United States Office Action in U.S. Appl. No. 13/739,384, dated Jul. 2, 2014.

\* cited by examiner

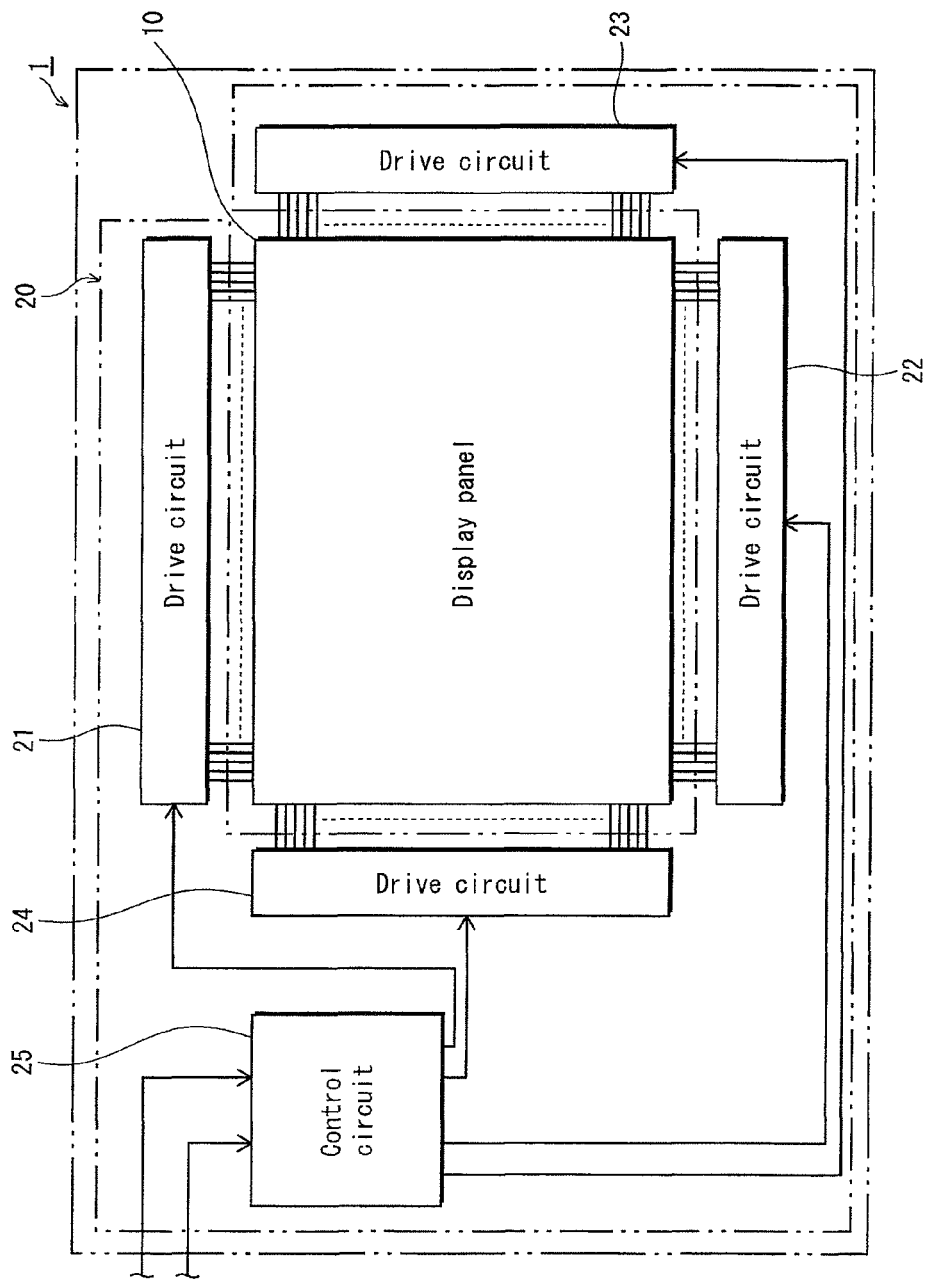

LIGHT EMITTING ELEMENT, METHOD FOR MANUFACTURING SAME, AND LIGHT EMITTING DEVICE

CROSS REFERENCE TO RELATED APPLICATIONS

This is a continuation application of PCT Application No. PCT/JP2010/004957 filed Aug. 6, 2010, designating the United States of America, the disclosure of which, including the specification, drawings and claims, is incorporated herein by reference in its entirety.

TECHNICAL FIELD

The present disclosure relates to a light-emitter that takes advantage of an electroluminescence phenomenon of an organic material, a method of manufacturing the same and a light-emitting device.

DESCRIPTION OF THE RELATED ART

In recent years, an organic electroluminescence element (hereinafter referred to as "organic EL element") has been studied and developed. The organic EL element is a light-emitter that takes advantage of an electroluminescence phenomenon of an organic material. The organic EL element has a structure in which an organic light-emitting layer is positioned between an anode and a cathode. A hole is injected from the anode and an electron is injected from the cathode. In this way, the hole and the electron are recombined in the organic light-emitting layer. This is how the organic EL element emits light. Note that a form of the light-emitting layer is defined by a bank that is formed with use of an insulating material.

Between the anode and the organic light-emitting layer is provided any of layers such as a hole-injection layer, a hole-transport layer and a hole injection transport layer, as needed. Between the cathode and the organic light-emitting layer is provided any of layers such as an electron-injection layer, an electron-transport layer and an electron-injection/transport layer, as needed. Hereinafter, the hole-injection layer, the hole transport layer, the hole injection transport layer, the electron-injection layer, the electron-transport layer and the electron-injection/transport layer are collectively referred to as a "charge-injection/transport layer".

A charge-injection/transport layer of a conventional organic EL element is formed with use of a conductive polymer material such as PEDOT (a mixture of polythiophene and polystyrene sulfonate) as shown in the following chemical formula 1 (see Patent Literature 1, for example).

[Chemical formula 1]

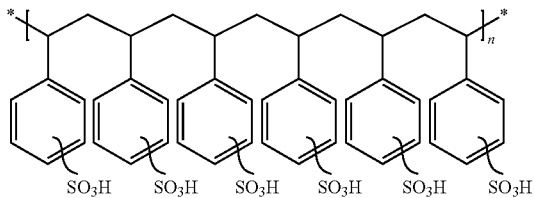

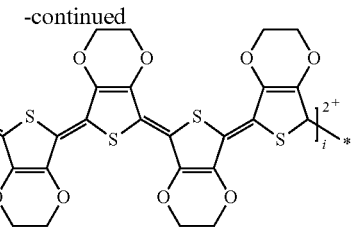

-continued

In recent years, technology has been developed in which the charge-injection/transport layer is formed with use of metal oxide such as transition metal oxide in place of the PEDOT (see Patent Literatures 2 and 3, for example). An organic EL element having the charge-injection/transport layer formed with use of the metal oxide generally has the following advantages compared to the organic EL element having the charge-injection/transport layer formed with use of the PEDOT. One of the advantages is that the organic EL element has an excellent voltage-current density property. The other advantage is that the organic EL element is less likely to deteriorate even if a large current is applied to increase light-emitting intensity.

CITATION LIST

Patent Literature

[Patent Literature 1] Japanese Patent Application Publication No. 2007-527542
[Patent Literature 2] Japanese Patent Application Publication No. 2007-288071
[Patent Literature 3] Japanese Patent Application Publication No. 2005-203339
[Patent Literature 4] Japanese Patent Application Publication No. 10-162959

SUMMARY

However, even if the metal oxide is used for forming the charge-injection/transport layer as described above, it is still necessary to further improve the light-emitting property. Also, it is necessary to further lengthen an operating life of the element.

One non-limiting and exemplary embodiment provides a light-emitter, a method of manufacturing the same and a light-emitting device. Here, the light-emitter has a high light-emitting property and a long operating life even if the metal oxide is used for forming the charge-injection/transport layer.

In one general aspect, the techniques disclosed here feature a double-sided light-emitter that emits light from both sides thereof, comprising: a first electrode; a layered body disposed on the first electrode, the layered body including a charge injection layer and a functional layer, the functional layer including a light-emitting layer; a second electrode disposed on the layered body; and a bank that defines a position of the light-emitting layer, wherein the first electrode and the second electrode are transparent electrodes, the charge injection layer is formed by oxidation of an upper portion of a metal, the first electrode includes a metal layer that is a lower portion of the metal, an inner portion of the charge injection layer is depressed to define a recess, an upper peripheral edge of the recess is covered with a portion of the bank, a portion of the light-emitting layer is interposed between the second electrode and the upper peripheral edge of the recess, the portion of the light-emitting layer is interposed between the second electrode and the portion of the bank, and undergoes charge injection from the second electrode, and the portion of the bank is interposed between the upper peripheral edge of the recess and the part of the light-emitting layer.

With the stated structure, an upper peripheral edge of the recess included in the charge-injection/transport layer is covered with a portion of a bank. Therefore, it is possible to suppress the electrical field from being concentrated in the upper peripheral edge of the recess when light is emitted. Therefore, the light-emitter pertaining to one aspect of the present invention has a light-emitting property and an operating life that have been further improved.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 2 is a block diagram that schematically shows an overall structure of a display device 1 pertaining to a first embodiment.

DETAILED DESCRIPTION

Background Leading to the Invention

The inventors have found, after an earnest research, that the following problems arise when a charge-injection/transport layer is formed with use of metal oxide as described in the above Description of the Related Art. After the formation of the charge-injection/transport layer, a surface portion of the charge-injection/transport layer is partially depressed after being eroded by solution used for a wet process for forming a bank. This forms a recess and causes an electrical field to be concentrated in an upper peripheral edge of the recess when light is emitted. The inventors had studied these problems much and have found the following facts.

Figure 1A:
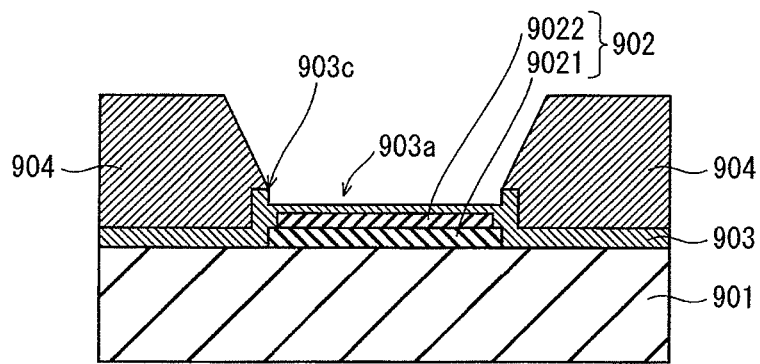
FIG. 1A and FIG. 1B each show an end elevation used for explaining how one aspect has been reached.
Figure 1B:
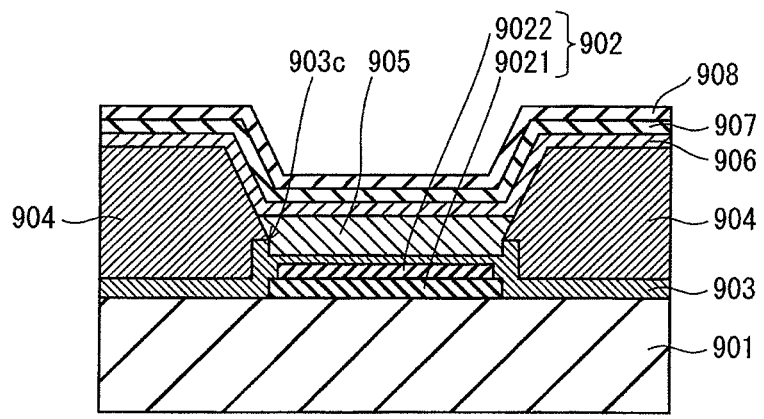

FIG. 1A and FIG. 1B show end elevations each showing part of a process of manufacturing an organic EL display.

As shown in FIG. 1A, an anode 902, a hole injection transport layer 903 and a bank 904 are formed on a TFT substrate 901. Note that the anode 902 has a layer structure in which an anode base layer 9021 and an ITO (Indium Tin Oxide) layer 9022 are layered on a surface of the TFT substrate 901 in the stated order.

As shown in FIG. 1B, an organic light-emitting layer 905, an electron-injection layer 906, a cathode 907 and a passivation layer 908 are layered on the hole injection transport layer 903 in the stated order.

When the hole injection transport layer 903 is formed with use of the metal oxide, a recess 903a is formed on an upper surface of the hole injection transport layer 903 (see FIG. 1A) in a process of forming the bank 904. When the organic light-emitting layer 905 is formed with the recess 903a formed on the upper surface of the hole injection transport layer 903 (see FIG. 1B), the following phenomenon occurs. That is, an electrical field is concentrated in a vicinity of an edge 903c of the recess 903a (see FIG. 1A) when light is emitted in an organic El display. As a result, current locally flows to the organic light-emitting layer 905 in some cases, which results in uneven brightness on a light-emitting surface and a short operating life due to a local deterioration.

The above-described problems and findings are unique to an organic EL display panel whose hole injection transport layer 903 is formed with use of the metal oxide. Also, the above-described problems and findings had not been ascertained. Therefore, these problems and findings have technical significance.

As described in the above, the inventors have reached the following technical features after a series of research and studies. That is, when the hole injection transport layer is formed with use of the metal oxide, the upper peripheral edge of the recess is covered with a portion of a bank. This suppresses the electrical field from being concentrated in a vicinity of the upper peripheral edge of the recess when light is emitted. As a result, the current is suppressed from locally flowing to the organic light-emitting layer.

Overview of Aspects of the Present Invention

In one general aspect, the techniques disclosed here feature a double-sided light-emitter that emits light from both sides thereof, comprising: a first electrode; a layered body disposed on the first electrode, the layered body including a charge injection layer and a functional layer, the functional layer including a light-emitting layer; a second electrode disposed on the layered body; and a bank that defines a position of the light-emitting layer, wherein the first electrode and the second electrode are transparent electrodes, the charge injection layer is formed by oxidation of an upper portion of a metal, the first electrode includes a metal layer that is a lower portion of the metal, an inner portion of the charge injection layer is depressed to define a recess, an upper peripheral edge of the recess is covered with a portion of the bank, a portion of the light-emitting layer is interposed between the second electrode and the upper peripheral edge of the recess, the portion of the light-emitting layer is interposed between the second electrode and the portion of the bank, and undergoes charge injection from the second electrode, and the portion of the bank is interposed between the upper peripheral edge of the recess and the part of the light-emitting layer.

With the above-mentioned structure, since the upper peripheral edge of the recess formed in the charge injection layer is covered with the portion of the bank and the bank is made of an insulative material, the electrical field concentration in the vicinity of the upper peripheral edge of the recess is suppressed when the light-emitter emits light. As a result, localized flow of current is suppressed in the light-emitting layer.

The bank may be formed by a solution, and the solution may be erosive to the charge injection layer formed by oxidation of the upper portion of the metal. As described above, when the bank is formed by a solution that is erosive to the charge injection layer formed by oxidation of the upper portion of the metal, the charge injection layer having a recess is formed as described above. In this regard, when the upper peripheral edge of the recess is covered with the portion of the bank, localized flow of current is suppressed in the light-emitting layer.

The portion of the bank that is on the outer portion of the charge injection layer may be adjacent to the recess, and an inner side wall of the bank may slope upwardly with respect to a bottom surface of the recess. With such a structure, when the light-emitting layer is formed with use of ink in printing technology such as an inkjet method, the ink can be easily absorbed in every corner of the area defined by the bank. As a result, formation of a void etc. can be suppressed.

The charge injection layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The first electrode may be a laminate including a semi-transparent or transparent metal thin film, the metal thin film may contain any material selected from the group consisting of Ag, Mg, Al, Pt, Pd, Au, Ni, Ir and Cr, and has a thickness falling within a range of 3 nm to 30 nm.

The second electrode may be made from ITO or IZO.

The second electrode may be a laminate including a semi-transparent or transparent metal thin film.

The metal thin film may contain any material selected from the group consisting of Ag, Mg, Al, Pt, Pd, Au, Ni, Ir and Cr, and may have a thickness falling within a range of 3 nm to 30 nm.

The bank may be formed by a solution, and the solution may be erosive to the charge injection layer formed by oxidation of the upper portion of the metal.

The portion of the bank that is on the outer portion of the charge injection layer may be adjacent to the recess, and an inner side wall of the bank may slope upwardly with respect to a bottom surface of the recess.

The portion of the bank that is on the outer portion of the charge injection layer may be displaced from a bottom surface of the recess. When such a structure is adopted, it is not necessary to allow the bank material to reach a bottom surface of the recess. Therefore, a temperature for the heat treatment can be low or time necessary for the heat treatment can be shortened.

The light-emitting layer may be an organic EL layer.

The outer portion of the charge injection layer may protrude along a base of the bank.

The portion of the bank that is on the outer portion of the charge injection layer may be defined by an angle formed between two surfaces, one of the two surfaces being a top surface of the outer portion of the charge injection layer and the other of the two surfaces being a side wall of the bank.

Another aspect provides a light-emitting device including a plurality of the light-emitter described above.

Yet another aspect provides a method of manufacturing a double-sided light-emitter emitting light from both sides thereof and including a first electrode; a layered body that is over the first electrode and includes a charge injection layer and a functional layer including a light-emitting layer, a second electrode over the layered body; and a bank that defines a position of the light-emitting layer, the method comprising: forming a metal layer from a semi-transparent or transparent metal thin film; forming a first metal oxide layer by oxidizing an upper portion of the metal layer; forming a bank material layer on the first metal oxide layer; removing a portion of the bank material layer and a portion of the first metal oxide layer to expose an exposed surface of an unoxidized portion of the metal layer and to define an area from which the portion of the bank material layer and the portion of the first metal oxide layer have been removed; forming a second metal oxide layer by oxidizing an upper portion of the unoxidized portion of the metal layer around the exposed surface to form the charge injection layer, the charge injection layer including the second metal oxide layer and an unremoved portion of the first metal oxide layer, the first electrode including a portion of the metal layer that has not been oxidized; thermally treating an unremoved portion of the bank material layer, the unremoved portion of the bank material layer being on the unremoved portion of the metal oxide layer; forming a functional layer in the area after thermally treating the unremoved portion of the bank material layer, the functional layer being on the charge injection layer; and forming the second electrode from a transparent electrode, wherein the charge injection layer comprises a material that is erosive by a solution used for removing the portion of the bank material layer, an inner portion of the charge injection layer is eroded by the solution to define a recess having a bottom surface corresponding to the exposed surface so that the exposed surface is lower than a bottom surface of a portion of the unremoved portion of the bank material layer, and when thermally treating the unremoved portion of the bank material layer, the unremoved portion of the bank material layer is fluid to extend the bank to a peripheral edge of the recess.

The charge injection layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The metal thin film may contain any material selected from the group consisting of Ag, Mg, Al, Pt, Pd, Au, Ni, Ir and Cr, and may have a thickness falling within a range of 3 nm to 30 nm.

The transparent electrode may be made from ITO or IZO.

The method may further comprise: forming a semi-transparent or transparent metal thin film on the second electrode.

The metal thin film may contain any material selected from the group consisting of Ag, Mg, Al, Pt, Pd, Au, Ni, Ir and Cr, and may have a thickness falling within a range of 3 nm to 30 nm.

The metal thin film may be formed by vacuum forming.

The following describes examples of Embodiments and Modifications of the present invention.

It should be appreciated, however, that the specific embodiments and modifications described below are given for the purpose of illustrating the structures of the present invention and effects achieved by the structures. The present invention is not so limited and various other changes and modifications may be made without departing from the spirit and scope of the claimed invention.

First Embodiment

1. Overall Structure of Display Device 1

The overall structure of the display device 1 pertaining to a first embodiment is described with use of FIG. 2.

As shown in FIG. 2, the display device 1 includes a display panel 10 and a drive control unit 20 that is connected to the display panel 10. The display panel unit 10 is an organic EL panel that uses the phenomenon of electroluminescence occurring in organic material and is composed of an array of a plurality of organic EL elements.

The drive control unit 20 is composed of four drive circuits 21-24 and a control circuit 25.

Note that in an actual display device 1, the placement of the drive control unit 20 with respect to the display panel unit 10 is not limited in this way.

2. Structure of Display Panel 10

Figure 3:
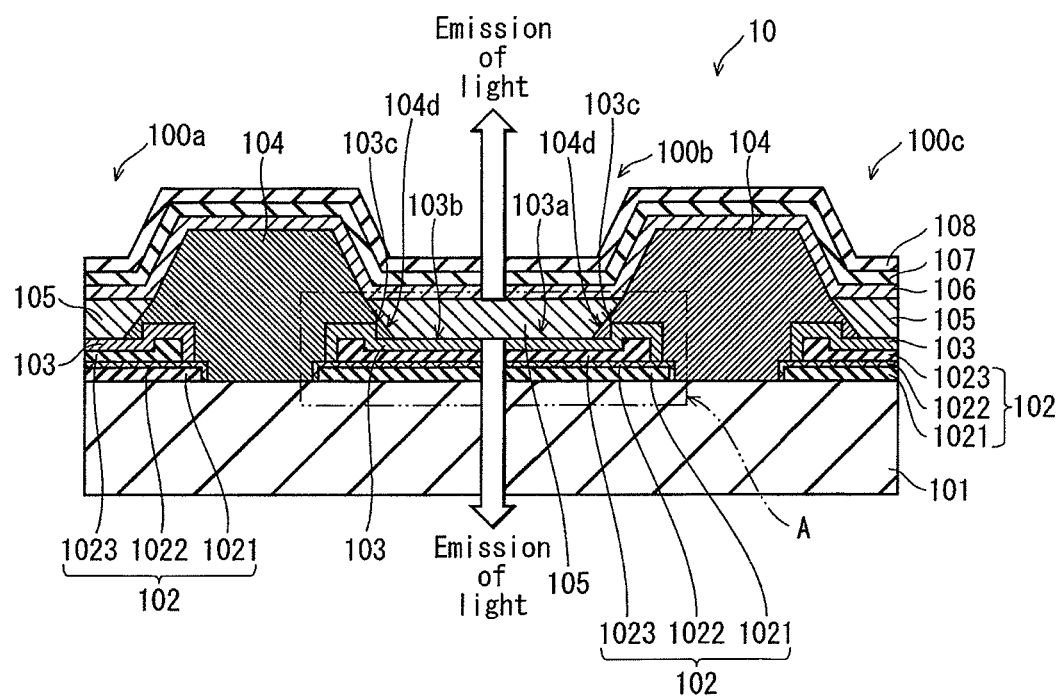
FIG. 3 is an end elevation that schematically shows a main part of a display panel 10 included in the display device 1.
Figure 4:
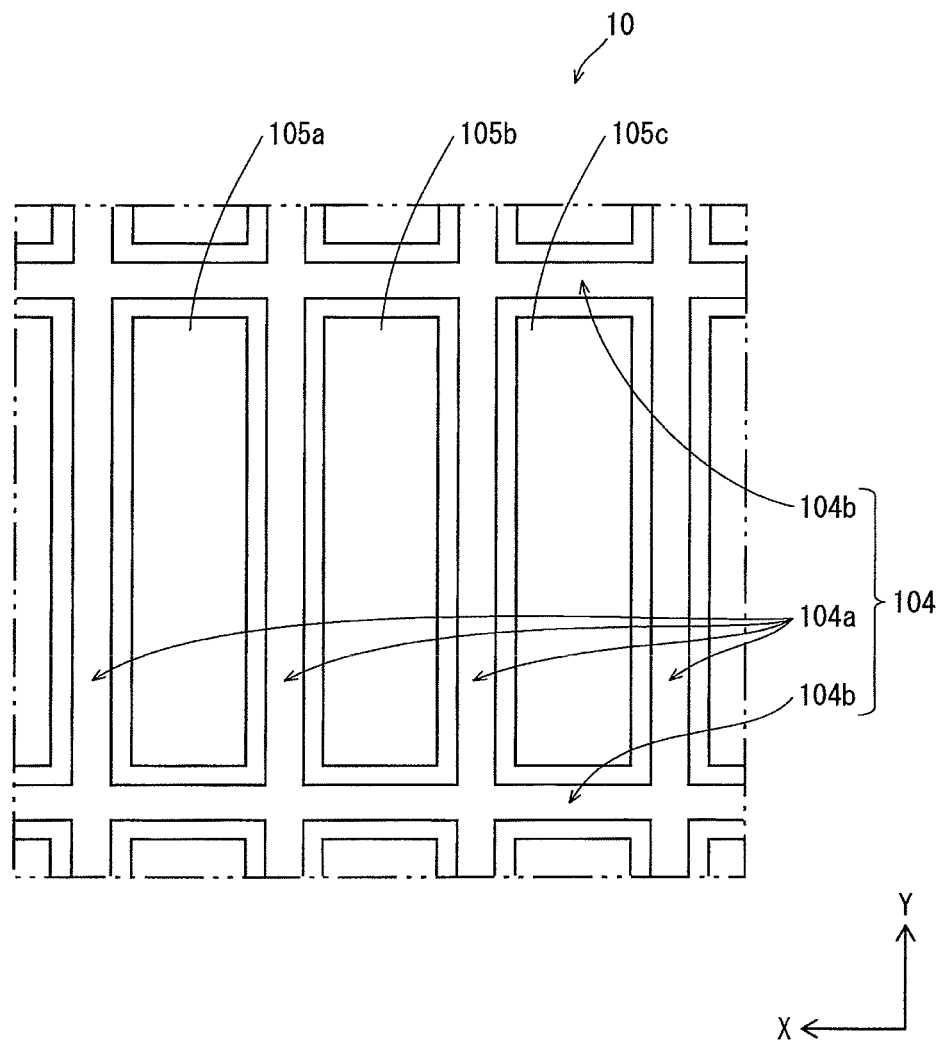
FIG. 4 is a schematic plane view that shows a form of a bank 104 included in the display device 1.

The following describes the structure of the display panel 10 with use of FIG. 3 and FIG. 4.

As shown in FIG. 3, the display panel 10 has a structure in which organic EL elements 100a, 100b and 100c are arranged in a matrix. Here, each of the organic EL elements 100a, 100b and 100c has an organic light-emitting layer that emits one of emission colors of red (R), green (G) and blue (B). The display panel 10 is a double-sided organic EL display.

An anode 102 is formed on a TFT substrate (hereinafter, simply referred to as "substrate") 101. A hole injection transport layer 103 is layered on the anode 102. Note that the anode 102 has a layer structure in which an anode base layer 1021, an ITO (Indium Tin Oxide) layer 1022 and an anode metal layer 1023 are layered on a surface of the substrate 101 in the stated order. Note that the anode 102 is separately formed for each of the organic light-emitting elements 100a, 100b and 100c.

As shown in FIG. 3, the hole injection transport layer 103 is provided peripherally above the anode 102. Above the hole injection transport layer 103, an organic light-emitting layer 105 is formed. Here, the organic light-emitting layer 105 is formed in an area defined by a bank 104 that is formed with use of an insulating material. Furthermore, an electron-injection layer 106, a cathode 107 and a passivation layer 108 are formed on the organic light-emitting layer 105. Here, the electron-injection layer 106, the cathode 107 and the passivation layer 108 are formed integrally over areas defined by the bank 104 through the organic El elements 100a, 100b and 100c. When driven, the display panel 10 emits light from both the side closer to the first electrode (anode 102) and the side closer to the second electrode (cathode 107).

Note that a so-called pixel bank is adopted as the bank 104 in the display panel 10 as shown in FIG. 4. Here, the pixel bank (bank 104) is formed such that bank elements 104a that extend in a Y direction and bank elements 104b that extend in an X direction are integrated. Also, organic light-emitting layers 105a, 105b and 105c (sub pixels) that are consecutive in the X direction are delimited from one another by the bank elements 104a. Similarly, the organic light-emitting layers 105a, 105b and 105c (sub pixels) that are consecutive in the Y direction are delimited from one another by the bank elements 104b.

As shown in FIG. 4, each of the three sub pixels that are consecutive in the X direction correspond to one of red (R), green (G) and blue (B). A set of the three consecutive sub pixels composes one pixel.

The following specifically explains each component. It should be noted here that each component should be transparent so that the organic EL display will be a double-sided display.

a) Substrate 101

The substrate 101 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

b) Anode 102

The anode 102 is formed as a transparent electrode. In this example, the anode 102 is formed from an anode base layer 1021. The anode base layer 1021 is formed with use of metal oxide such as ITO and IZO, or APC (alloy of silver, palladium and copper), ARA (alloy of silver, rubidium and gold), MoCr (alloy of molybdenum and chrome) or NiCr (alloy of nickel and chrome), for example.

Alternatively, the first electrode 2 may be a metal film containing any material selected from the group consisting of Ag, Mg, Al, Pt, Pd, Au, Ni, Jr and Cr. In any of the cases, the first electrode 2 is formed to be thick to some extent (e.g. film thickness of 3 nm to 30 nm) so as to have sufficient transparency. Although the anode 102, and the cathode 107 which will be described later, are both transparent electrodes, it should be noted here that they can be referred to as "semi-transparent or transparent" thin film, because they have a certain degree of transparency. Even in the case of a film made of metal material generally known as opaque material, the film can be semi-transparent or transparent and have the certain degree of transparency when processed to be thin as described above.

Figure 17:
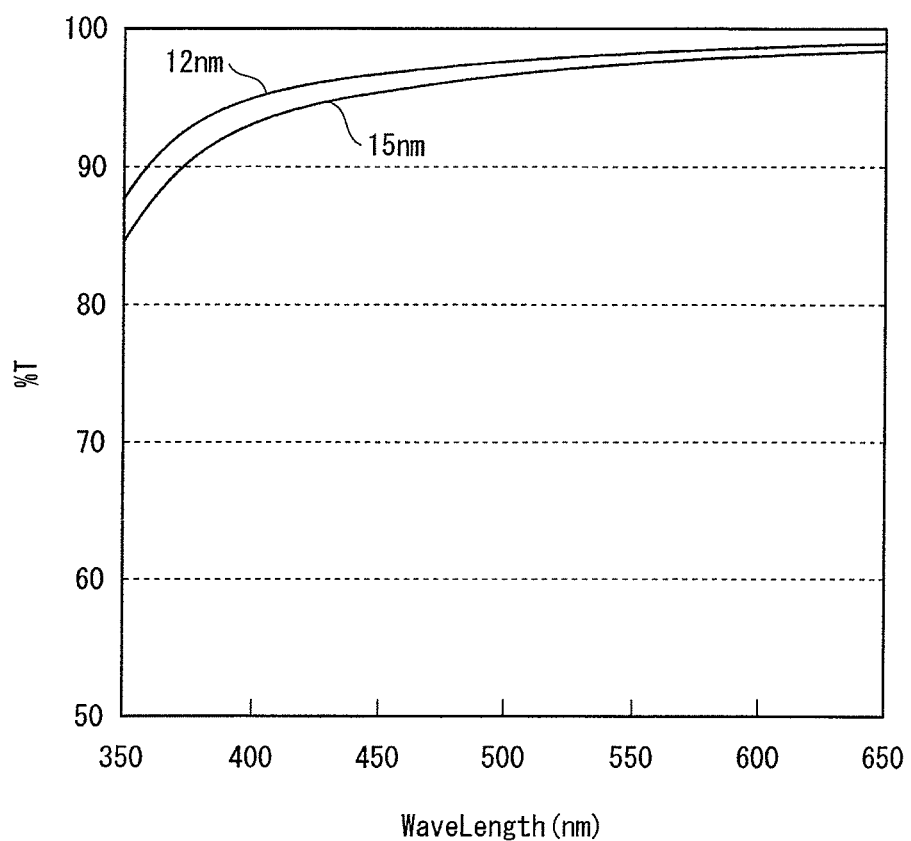
FIG. 17 is a graph showing a relationship between a wavelength and a degree of transparency of a transparent electrode.

FIG. 17 is a graph showing the relationship between the degree of transparency (T %) and the wavelength with respect to tungsten oxide (WOx) having a thickness of 12 nm or 15 nm. As shown in this figure, in the case of tungsten oxide, the degree of transparency will be equal to or greater than 85% with respect to a wide wavelength range covering 350 nm to 650 nm when the thick ness is set to fall within the range of 12 nm to 15 nm. Besides, academic paper (V. Bulovic, G. Gu, P. E. Burrows, S. R. Forrest, Nature vol. 380, 29 (1996)) discusses about a double-sided OELD using Mg—Ag alloy electrodes having a film thickness falling within the range of 5 to 40 nm. Furthermore, Patent Literature 2 shows that a desirable transparency can be achieved by setting the thickness of the cathode to fall within the range of 10 to 800 nm. In view of the findings above, it can be concluded that a sufficient transparency can be achieved with the anode 102 and the cathode 107 when the thickness of the metal material thereof is set to fall within the range of 3 nm to 30 nm.

The ITO layer 1022 is formed so as to cover the surface of the anode base layer 1021.

The anode metal layer 1023 is formed with use of a metal material such as silver (Ag), molybdenum (Mo), chrome (Cr), vanadium (V), tungsten (W), nickel (Ni) or iridium (Ir), or an alloy of these metal materials, for example.

Note that a surface portion of a metal layer is oxidized, and a remaining portion of the metal layer that has not been oxidized (lower metal layer) is the anode metal layer 1023 of the anode 102. This will be described in the section "Method of Manufacturing Organic EL element" below.

Figure 5:
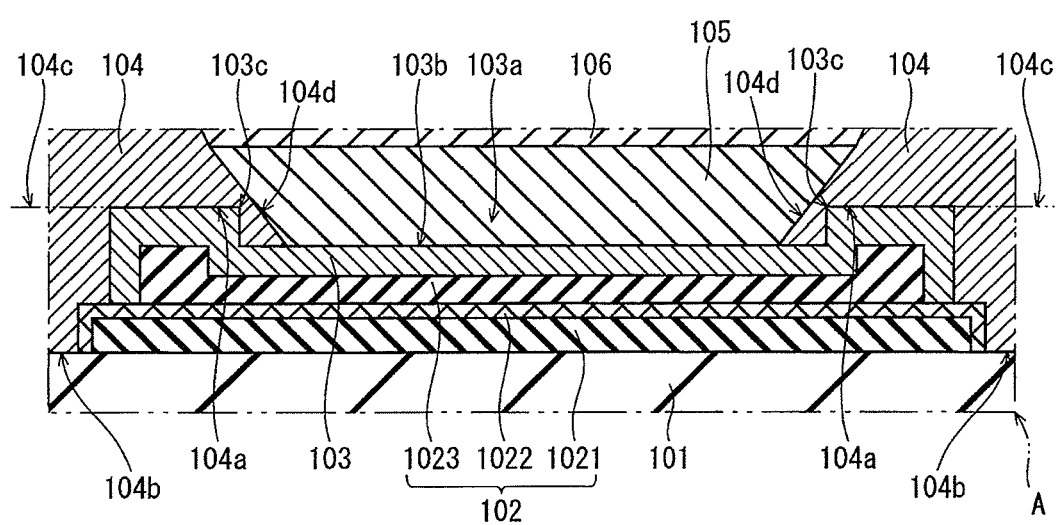
FIG. 5 shows, as a portion A, an end elevation which is a portion of FIG. 1 that has been enlarged.

Note that a portion of the anode metal layer 1023 under an opening formed in the bank 104 is smaller in film thickness than the other portion of the anode metal layer 1023 as shown in FIG. 5. It is desirable that the portion of the anode metal layer 1023 is 20 nm or less in film thickness. This is because when the portion is more than 20 nm in film thickness, a reflectance of each of the organic EL elements 100a, 100b and 100c reflects a reflectance of the anode metal layer 1023, and thus is unlikely to reflect the reflectance of the anode base layer 1021.

c) Hole Injection Transport Layer 103

The hole injection transport layer 103 is an upper metal oxide layer that is formed by oxidizing a surface portion of a metal layer as described in the above. The hole injection transport layer 103 is a layer of an oxide such as silver (Ag), molybdenum (Mo), chromium (Cr), vanadium (V), tungsten (W), nickel (Ni), iridium (Ir), etc. A hole injection transport layer 103 formed from such a metal oxide has the function of assisting with hole generation and of injecting and transporting holes stably into the organic light-emitting layer 105. The hole injection transport layer 103 has a high work function.

When the hole injection transport layer 103 is formed from an oxide of a transition metal, a plurality of levels can be occupied since there are a plurality of oxidation numbers. This makes hole injection easy and allows for reduction of driving voltage.

As shown in FIG. 5, the hole injection layer 103 extends laterally along bottom surfaces 104a and 104b of the bank 104, and has a recess 103a in an upper surface thereof. A base 103b of the recess 103a included in the hole injection transport layer 103 is positioned lower than a level 104c of the base 104a of the bank 104. The recess 103a in the hole injection transport layer 103 is approximately 5 nm to 30 nm in depth.

Also, the hole injection transport layer 103 is desirably 0.1 nm to 20 nm in film thickness, and is more desirably 1 nm to 10 nm in film thickness, for example. This is because when the film thickness of the hole injection transport layer 103 (i.e. thickness of the upper metal oxide layer (oxidized portion of the metal layer)) is smaller than the above-stated desirable value, a hole-injection property in terms of evenness decreases. When the film thickness of the hole injection transport layer 103 is larger than the above-stated desirable value, on the other hand, a drive voltage increases. Since the hole injection transport layer 103 is made from a metal oxide thin film that is thin enough as the first electrode 2, the hole injection transport layer 103 has desirable transparency as described with reference to FIG. 17.

Also, according to the organic EL elements 100a, 100b and 100c pertaining to the present embodiment, a peripheral edge 103c of the recess 103a included in the hole injection transport layer 103 is covered with a covering part 104d of the bank 104. The peripheral edge 103c included in the hole injection transport layer 103 protrudes higher than the base 103b of the recess 103a. If the peripheral edge 103c were not covered with the insulating covering part 104d, the electrical field would be concentrated in a vicinity of the peripheral edge 103c, and the current would locally flow to the organic light-emitting layer 105.

In the organic EL element 100a, 100b and 100c pertaining to the present embodiment, however, the above-mentioned problems are prevented, because the upper peripheral edge 103c is covered with the covering part 104d made from an insulating material. Note that it is desirable that the thickness of the covering part 104d of the bank 104 (shortest distance between the peripheral edge 103c and the organic light-emitting layer 105) is 2 nm to 5 nm in order to effectively suppress the electrical field concentration.

In an example of FIG. 2 and FIG. 3, the upper peripheral edge 103c of the recess of the hole injection transport layer 103 has a right angle. The upper peripheral edge 103c of the recess, however, may have a plurality of angles, or may be curved. In such a case, the electrical field concentration is further suppressed.

Also, according to the organic EL elements 100a, 100b and 100c pertaining to the present embodiment, the covering part 104d of the bank 104 reaches the base 103b of the recess 103a included in the hole injection transport layer 103. Also, each inner side wall of the bank 104 slopes upwardly with respect to the base 103b of the recess 103a included in the hole injection transport layer 103. With such a structure, when the organic light-emitting layer 105 is formed with use of ink in printing technology such as an inkjet method, the ink can be easily absorbed in every corner of the area defined by the bank. As a result, formation of a void etc. can be suppressed.

The method of oxidizing the surface portion of the metal layer in order to form the hole injection transport layer 103 is not particularly limited. Therefore, examples of the process that can be adopted are natural oxidization, ultraviolet ozone process on a principal surface of the metal layer, a plasma process under an oxidized gas atmosphere and a process with use of solution containing ozone.

d) Banks 104

The banks 104 are formed with an organic material, such as resin, and have insulating properties. Examples of the organic material used to form the banks 104 include acrylic resin, polyimide resin, styrenic resin, polycarbonate resin, novolac-type phenolic resin, etc. It is desirable that the bank 104 be resistant to organic solvent. Furthermore, since the banks 104 may undergo processes such as etching, baking, etc. when formed, it is preferable that the banks 107 be formed from highly resistant material that will not change excessively in shape or quality during such processes. To provide the banks 107 with liquid repellency, the surface thereof can be fluoridated.

Note that as the insulating material used in forming the banks 104, any liquid repellent material with a resistivity of $10^5 \Omega \cdot cm$ or greater can be used as well as the above materials. Using a material with a resistivity of $10^5 \Omega \cdot cm$ or less leads to production of leak current between the anodes 102 and the cathode 107, or between adjacent elements. Such leak current causes a variety of problems such as increased power consumption.

Furthermore, if a hydrophilic material is used to form the banks 104, the difference in affinity/liquid repellency between the surface of the banks 104 and the surface of the hole injection transport layer 103 becomes small, and it thus becomes difficult to selectively maintain the ink, which includes an organic substance for forming the organic light-emitting layer 105, at the opening of the banks 104.

The structure of the banks 104 need not be a single layer as shown in FIG. 3 and FIG. 5, but may adopt a two or more layered structure. In such a case, the above materials may be combined for each layer, or layers may alternate between non-organic and organic material.

e) Organic Light-Emitting Layer 105

The organic light-emitting layer 105 as a functional layer has a function of emitting light when an excitation state is produced by the recombination of holes with electrons. The material used to form the organic light-emitting layer 105 needs to be a light-emitting organic material, a film of which can be formed by wet printing.

Specifically, it is desirable that the organic light-emitting layer 105 is made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

f) Electron Injection Layer 106

The electron injection layer 106 has the function of transporting electrons injected through the cathode 107 to the organic light-emitting layer 105 and is desirably formed, for example, of barium, phthalocyanine, lithium fluoride, or a combination thereof.

g) Cathode 107

The cathode 107 is made from transparent electrode material that is similar to the material of the anode 102, and is formed to have an appropriate film thickness (3 nm to 30 nm) in the same manner as the anode 102 so as to achieve desirable transparency.

The material used to form the cathode 107 may, in addition to the above materials, be for example an alkali metal or alkali earth metal, or a laminate structure having, in the following order, a layer that includes a halide of an alkali metal or alkali earth metal and a layer that includes silver. The above-stated layer containing silver may be formed with use of silver alone or silver alloy. In either case, the layer has to have enough transparency. Also, in order to increase light takeoff efficiency, a highly transparent refraction index adjustment layer may be provided above the layer that includes silver.

h) Passivation Layer 108

The passivation layer 108 has the function of controlling the organic light-emitting layer 105 or other layers from being exposed to water or air and is formed, for example, with silicon nitride (SiN), silicon oxynitride (SiON), etc. In the case of the top-emission type organic EL elements 100a, 100b and 100c, the passivation layer 108 is desirably formed with use of a light-transmitting material.

Problems of Double-Sided Element

In the case of double-sided light-emitters, an important factor of the luminescence property of the element is that both the upper surface and the lower surface of the substrate efficiently produce light. Meanwhile, the inventors of the present invention have been making an effort to improve the luminescence property of the organic EL element by using a metal compound as the charge-injection/transport layer of the organic EL element.

However, in generally, metal compounds absorb visible light at a certain rate. Therefore, there is a problem that the light generated by the light-emitting layer is absorbed by the charge-injection/transport layer absorbs before being emitted to the outside, which leads to the degradation of the luminous efficiency.

There is another problem. When the peripheral edge of the recess formed in the surface of the charge-injection/transport layer is not covered with an insulative covering part, electric field concentrates in the vicinity of the edge of the recess, and localized flow of current might occur in the light-emitting layer. As a result, the uneven luminance occurs in a light-emitting surface and a life of the organic EL element is reduced due to localized deterioration of the light-emitting layer.

In particular, when localized light emission occurs in the light-emitting surface, it means that the light-emitting surface includes a light-emitting area and a non-light-emitting area. If the element is the double-sided light-emitter, the non-light-emitting area does not contribute to the light emission, and the substrate will be simply transparent. As a result, the background behind the light-emitter is seen through the substrate, and the display quality of the light-emitter or the display panel using such light-emitters will be degraded.

In view of the problems above, the present embodiment provides the following structure: in an area defined by a bank 104, a charge-injection/transport layer (hole injection transport layer 103) has a recess 103a in an upper surface thereof, and a light-emitting layer 105 is formed on the bottom of the recess 103a. By using the recess 103a which is a relatively thin part in the hole injection transport layer 103, the absorption rate of the light emitted from the light-emitting layer 105 when driven is reduced.

This effect will be specifically described next. For example, when a tungsten oxide layer is used as the charge-injection/transport layer, the optical transmittance at the wavelength of 400 nm is 95% when the film thickness of the tungsten oxide layer is 12 nm and 93% when the film thickness is 15 nm. The optical transmittance at the wavelength of 450 nm is 97% when the film thickness of the tungsten oxide is 12 nm and 95% when the film thickness is 15 nm. The optical transmittance at the wavelength of 530 nm is 98% when the film thickness of the tungsten oxide is 12 nm and 97% when the film thickness is 15 nm. In this way, even though the difference in the film thickness of the tungsten oxide is only 3 nm, the optical transmittance greatly differs. That is, the difference in the optical transmittance increases in proportion to the difference in the film thickness.

In the case of a device like an organic EL display having a multilayer structure, the optical transmittance of the device is obtained by multiplying the transmittances of the layers. Therefore, it is important to improve the optical transmittance of each layer so as to be close to 100%. In particular, in the case of blue light, which involves difficulty in development of the material, the present embodiment is effective for improving the optical transmittance and the luminous efficiency, and is therefore effective for improving the characteristics of the device in total. As described above, the recess formed in the area of the charge-injection/transport layer defined by the bank improves the optical transmittance of the light-emitting area, which leads to a desirable double-sided light-emitter. A desirable range of the depth of the recess 103a is approximately 5 nm to 30 nm.

Furthermore, in the present embodiment, the peripheral edge of the recess 103a formed in the hole injection transport layer 103 is covered with a portion of the bank 104. This prevents localized light emission in the light-emitting surface, and realizes uniform light emission from the entirety of the desired light-emitting area. As described above, no non-light-emitting area, which does not contribute to lighting, is formed in the light-emitting surface. Therefore, light generated by the light-emitting layer is emitted outside from both the upper surface and the lower surface of the display with high luminous efficiency (as indicated by the arrows shown in FIG. 3). As a result, desirable light emission or display is realized while preventing the background behind the double-sided light-emitter from being seen through the substrate.

3. Manufacturing Method of Display Panel 10

A manufacturing method of the display panel 10 is described with reference to FIGS. 6 through 8. Note that one of organic EL elements included in the display panel 10 is taken as an example and schematically shown in these drawings.

Figure 6A:
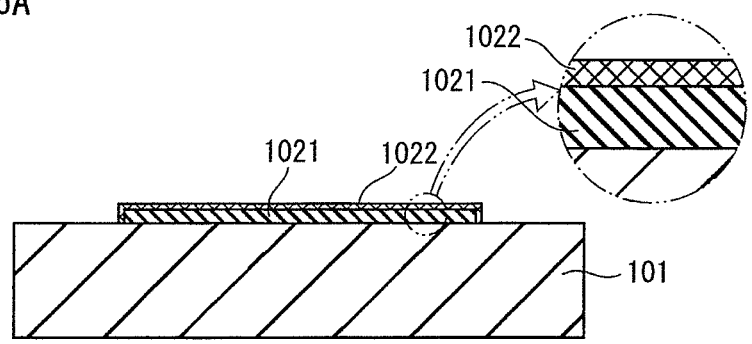
FIGS. 6A, 6B and 6C are end elevations that each schematically show part of a process in manufacturing the display device 1.

First, as shown in FIG. 6A, the first electrode 2 is formed on the substrate 101 by vacuum forming. As the vacuum forming, a known process may be adopted, such as a vacuum deposition method, sputtering, an electron beam method, a CVD method, or ion plating. When sputtering is selected from the methods listed above to form an Ag thin film, a sputtering apparatus is used. The sputtering apparatus utilizes a known DC magnetron sputtering method, for example. The chamber is filled with an inactive gas such as an argon gas at a predetermined pressure (e.g. $3 \times 10^{-1}$ Pa), and an Ag thin film is uniformly formed on the surface of the substrate 1. Subsequently, the Ag thin film is patterned by photo lithography, and thus the anode base layer 1021 is formed in a matrix.

Alternatively, when a vacuum deposition method is used, resistance heating is desirable. Specifically, pellets for deposition containing a predetermined transparent electrode material, or particles of the material, are put into a resistance heating boat or a resistance heating filament of a vacuum deposition apparatus. Next, the substrate 101 is attached to a given substrate holder, the inside pressure of the chamber is reduced to $5 \times 10^{-4}$ Pa, the substrate is heated to approximately 10° C. to 100° C., and the film is formed at a deposition speed of no greater than 20 nm/sec. After this process, the deposited film is patterned as described above.

Next, an ITO thin film is formed on a surface of the anode base layer 1021 by vacuum forming (e.g. spattering method) that is similar to the method applied to the anode base layer 1021. Then, the patterning is performed on the ITO thin film with use of the photolithography, for example, to form the ITO layer 1022.

Figure 6B:
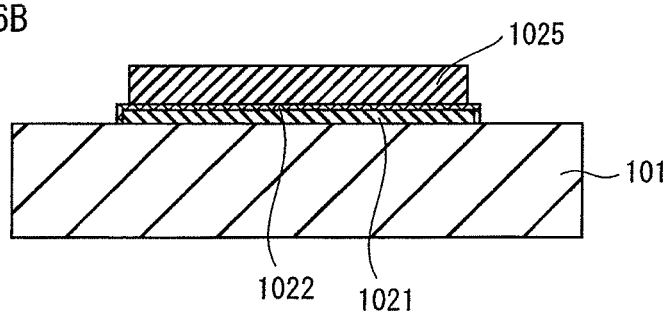

Next, a metal film of Mo—Cr (97:3) is formed on the principal surface of the substrate 101 including the ITO layer 1022 with use of a similar method as applied to the anode base layer 1021 such as vacuum deposition and spattering, as shown in FIG. 6B. Here, the metal film is 100 nm in film thickness. Then, the patterning is performed on the metal film of Mo—Cr (97:3) with use of a method using a photosensitive resist (the photolithography method or the etching method). After the patterning, the photosensitive resist is removed. As a result, a metal layer 1025 is formed. When the etching method is adopted for forming the metal layer 1025, mixed solution of phosphoric acid, nitric acid and acetic acid may be used as etching solution.

Figure 6C:
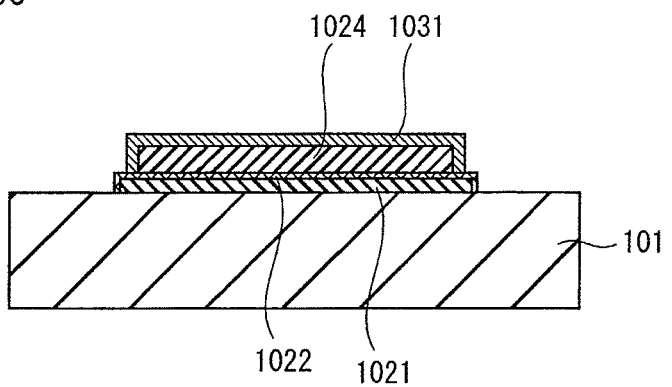

As shown in FIG. 6C, a surface portion of the metal layer 1025 formed on the ITO layer 1022 as shown in the above is naturally oxidized. The oxidized portion becomes a metal oxide layer 1031. The remaining portion of the metal layer 1025 that has not been oxidized becomes a metal layer 1024. At this stage, the oxidized portion (the metal oxide layer 1031) is 1 nm to 5 nm in film thickness, for example.

Figure 7A:
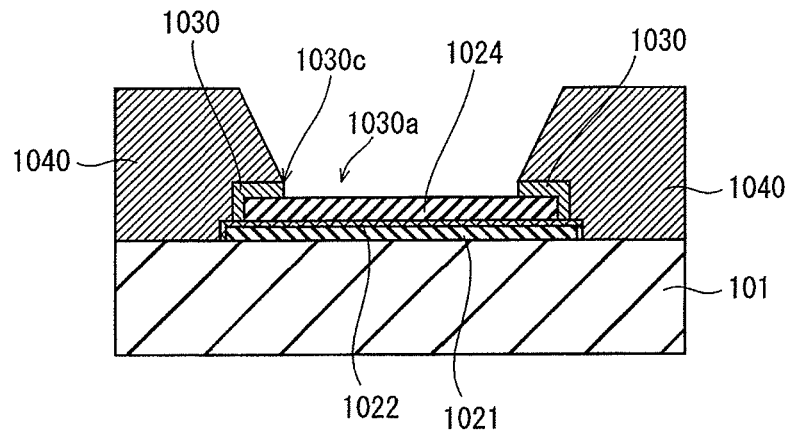
FIGS. 7A, 7B and 7C are end elevations that each schematically show part of the process in manufacturing the display device 1.

Next, a film is formed on the metal oxide layer 1031 with use of an insulating material in a spin coat method, for example. This film is formed for forming the bank 104. The patterning is performed on this film so as to have a predetermined form by an exposure method using a photomask and a developing method using a given developer (e.g. tetramethylammonium hydroxide (TMAH) solution). As a result, a bank preparation layer 1040 (layer formed of a bank material) is formed. Subsequently, substrate cleaning (wet process) is executed with use of neutral detergent (or an aqueous or non-aqueous release agent) and pure water so as to clear etching residue as the bank residue. At this point, since the metal oxide layer 1031 is soluble in pure water or a TMAH solution, substantially all the exposed bottom part under the opening formed in the bank preparation layers 1040 of the metal oxide layer 1031 elutes during the wet process. Therefore, the metal oxide layer 1030 has a recess 1030a which is formed under the opening formed in the bank preparation layers 1040 as shown in FIG. 7A. Therefore, a portion of a surface of the metal layer 1024 is exposed to the opening.

Note that a remaining portion of the metal oxide layer 1030 under a remaining portion of the bank preparation layer 1040 other than the opening does not elute. Therefore, portions of the metal oxide layer 1030 corresponding to side walls of the recess 1030a are exposed, and a peripheral edge 1030c is formed in the metal oxide layer 1030.

Next, a portion of the metal layer 1024 that is exposed to the opening of the bank preparation layer 1040 is naturally oxidized again. A combination of the remaining portion of the metal oxide layer 1030 and the newly oxidized portion of the metal layer 1024 is the hole injection transport layer 103. Also, the remaining lower portion of the metal layer 1024 that has not been oxidized is an anode metal layer 1023 (see FIG. 7B).

Figure 7B:
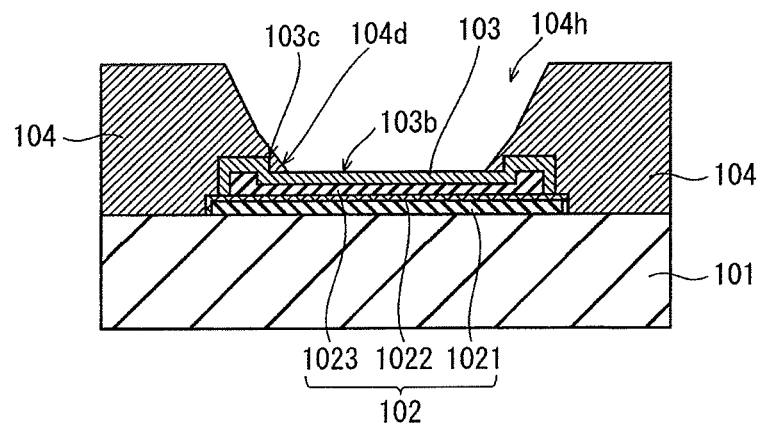

When the organic EL element is in the above-described state, the remaining portion of the bank preparation layer 1040 is thermally treated so as to have some fluidity. As a result, the bank material (insulating material) of the remaining portion of the bank preparation layer 1040 extends to the base 103b of the recess. Thus, the peripheral edge 103c included in the hole injection transport layer 103 is covered with the covering part 104d that is formed by extending the bank material as shown in FIG. 7B.

A heat cure can be adopted as the thermal treatment applied to the bank preparation layer 1040. The temperature and time for the heat cure may be appropriately determined in consideration of a type of the bank material and a required thickness of the covering part 104d and so on. Subsequently, a repellant process is performed on a surface of the remaining portion of the bank preparation layer 1040 with use of fluorine plasma, for example, so as to form the bank 104.

Figure 7C:
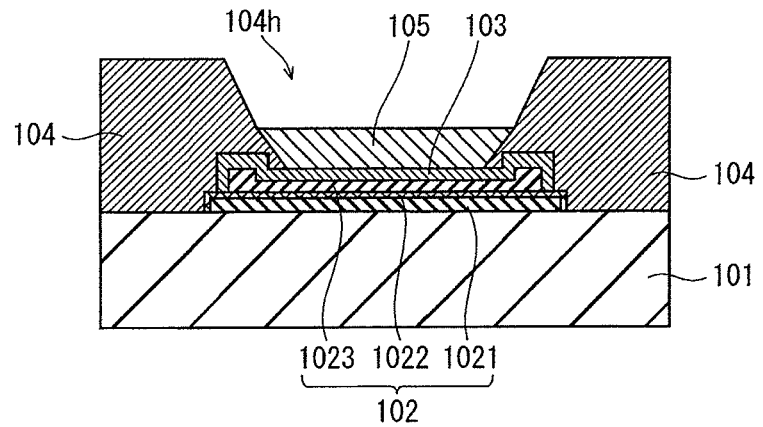

Next, as shown in FIG. 7C, drops of composite ink (hereinafter, simply referred to as "ink") including an organic EL material is put into an area 104*h* defined by the bank 104 in an inkjet method, for example. The, the ink is dried to form the organic light-emitting layer 105. Note that the ink may be dropped by a dispenser method, a nozzle-coat method, a spin coat method, an intaglio printing, a letter press printing, or the like.

In the above-described ink drying process, the ink is dried in a vacuum at a temperature of 50° C. for 10 minutes. Then, the ink is baked at a temperature of 130° C. under a nitrogen atmosphere for 30 minutes. An average film thickness of the organic light-emitting layer 105 is approximately 70 nm.

Figure 8A:
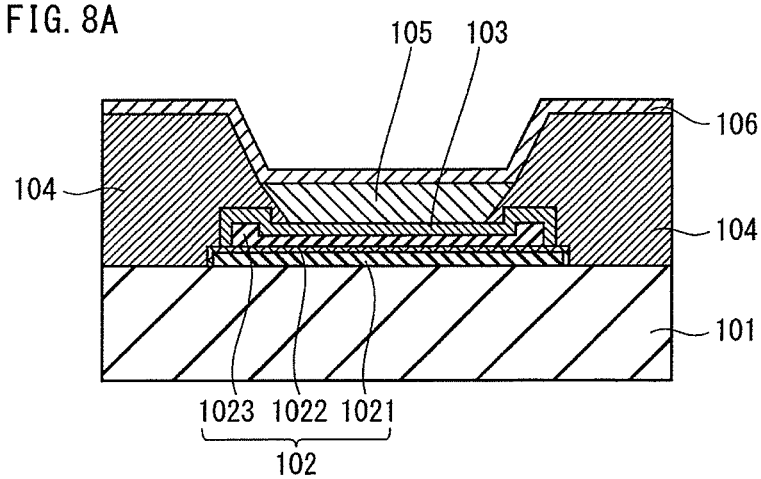
FIGS. 8A, 8B and 8C are end elevations that schematically show part of the process in manufacturing the display device 1.

As shown in FIG. 8A, a film of valium (manufactured by Aldrich, with a purity of 99% or more) that is 5 nm in film thickness is formed on the light-emitting layer 105 and the bank 104, with use of a vacuum evaporating method. Subsequently, a film that is 20 nm in thickness is formed by combining valium (20%) with compound Alq (manufactured by Shin-Nippon Steel Chemical Co., Ltd., with a purity of 99% or more) with use of a co-evaporation method. Thus, the electron-injection layer 106 is formed.

Figure 8B:
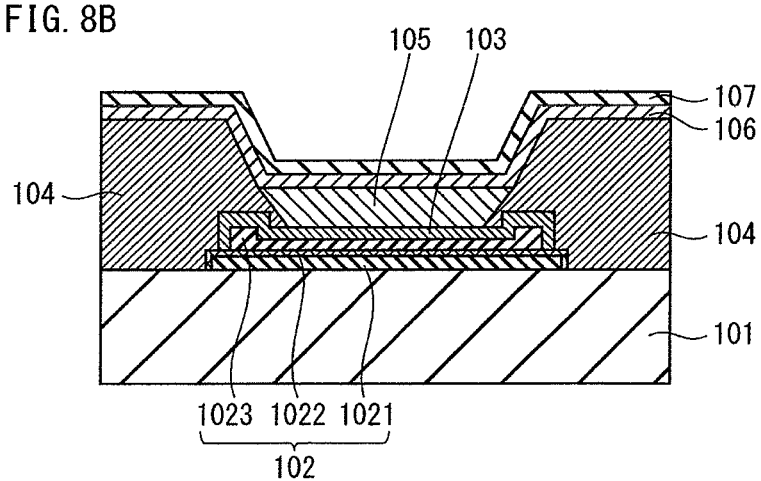

Next, as shown in FIG. 8B, the cathode 107 is formed on the electron injection layer 106 by similar vacuum forming (e.g. sputtering) as applied for forming the anode 102. At this point, the organic light-emitting layer 105 has already been formed. Therefore, considering the thermal influence and the convenience, it is desirable to form the cathode 107 by sputtering or vacuum deposition which applies heat to the substrate 1 at a relatively low temperature. Note that the intensity of the film formation should be well controlled so that the organic light-emitting layer 105 will not be damaged by plasma generate in the sputtering. As an apparatus for sputtering, a plasma coating apparatus manufactured by Sumitomo Heavy Industries may be used, for example. By using the method and the apparatus, an ITO thin film (with a thickness of 100 nm) is formed.

Figure 8C:
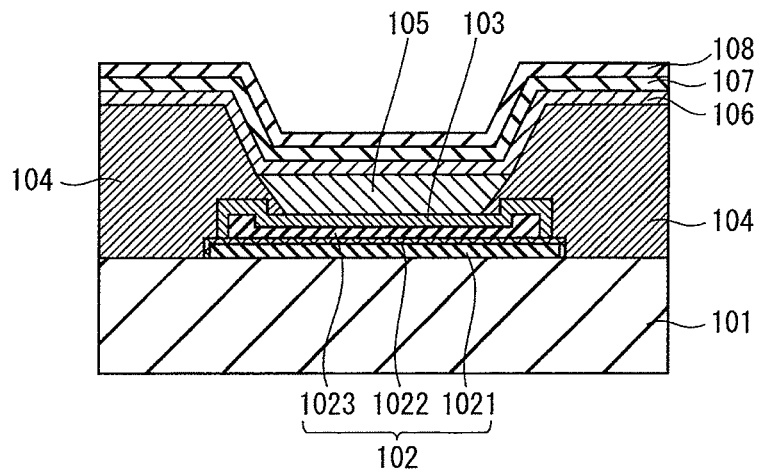

Furthermore, as shown in FIG. 8C, the passivation layer 108 is formed on the cathode 107 described above.

According to the method of manufacturing the display panel 10 pertaining to the present embodiment, the peripheral edge 103*c* that is formed on the exposed portion of the hole injection transport layer 103 in the manufacturing process is covered with the covering part 104*d* of the bank 104. The organic light-emitting layer 105 is formed on the covering part 104*d*. Therefore, it is possible to suppress the electrical field from being concentrated in the peripheral edge 103*c* of the hole injection transport layer 103.

4. Advantageous Effects

According to the display panel 10 of the display device 1 pertaining to the present embodiment, each of the organic EL elements 100*a*, 100*b* and 100*c* has the hole injection transport layer 103 formed with use of the metal oxide. Therefore, each of the organic EL elements 100*a*, 100*b* and 100*c* included in the display panel 10 generally has the following advantages compared to an organic EL element included in a hole injection transport layer formed with use of PEDOT. That is, each of the organic EL elements 100*a*, 100*b* and 100*c* has an excellent voltage-current density characteristic, and is unlikely to deteriorate even when a large current is flown to increase the light-emitting intensity.

Also, in each of the organic EL elements 100*a*, 100*b* and 100*c*, the surface portion of the metal layer is oxidized, and the surface portion of the metal layer that has been oxidized becomes the hole injection transport layer 103 while the remaining lower portion of the metal layer becomes the anode metal layer 1023 of the anode 102, as shown in FIG. 7B. Therefore, the number of layers to be formed in each of the organic El elements 100*a*, 100*b* and 100*c* can be reduced, and thus the number of processes can be reduced.

Furthermore, in each of the organic EL elements 100*a*, 100*b* and 100*c*, the peripheral edge 103*c* of the recess 103*a* included in the hole injection transport layer 103 is covered with the covering part 104*d* of the bank 104 that is formed with use of the insulating material. Therefore, it is possible to suppress the electrical filed from being concentrated in the peripheral edge 103*c* when light is emitted. Therefore, it is possible to suppress current from locally flowing to the organic light-emitting layer 105 in each of the organic EL elements 100*a*, 100*b* and 100*c* pertaining to the present embodiment.

As describe above, in the display device 1 pertaining to the present embodiment, each of the organic EL element 100*a*, 100*b* and 100*c* included in the display panel 10 is provided with the hole injection transport layer 103 made from a metal oxide. Therefore, the display device 1 has the advantages of excellent voltage-current density characteristics and of not deteriorating easily even when a high current flows to increase emission intensity. Furthermore, since the peripheral edge 103*c* of the recess 103*a* in the hole injection transport layer 103 is coated with the covering part 104*d* of the bank 104, current is prevented from locally flowing to the organic light-emitting layer 105 during the emission of light.

Furthermore, with the above-described manufacturing method, after the metal oxide layer 1031 having a uniform thickness is formed, a portion of the surface is dissolved during the washing of the etching residue by using pure water, in order to form a recess and reduces the thickness of the light-emitting area. Then, the hole injection transport layer 103 is formed. In a practical film forming process, the productivity of the film can be stabilized by adjusting the film thickness after forming a thick film compared to forming a thin film from the beginning.

That is, in the case of forming a very thin film by the film forming process, it is necessary to complete the process from the beginning to the end in a relatively short period. However, such a thin film is likely to vary in terms of the thickness, the quality, etc. This is because the film formation is performed during a period before the conditions for the film forming become stable (e.g. in the case of a sputtering method, the film formation begins before the plasma generated in the chamber by discharge becomes stable), and the film formed during such a period, which has unstable characteristics, occupies a large proportion to the entire film. In contrast, according to the above-described manufacturing method, the metal oxide layer 1031 having a certain thickness is formed first, and then a recess is formed in the surface by dissolving a portion of the surface. Therefore, the method is advantageous in that it is possible to efficiently form the hole injection transport layer 103 having an excellent charge injection transport property and whose thickness is thin in the light-emitting area.

Second Embodiment

Figure 9:
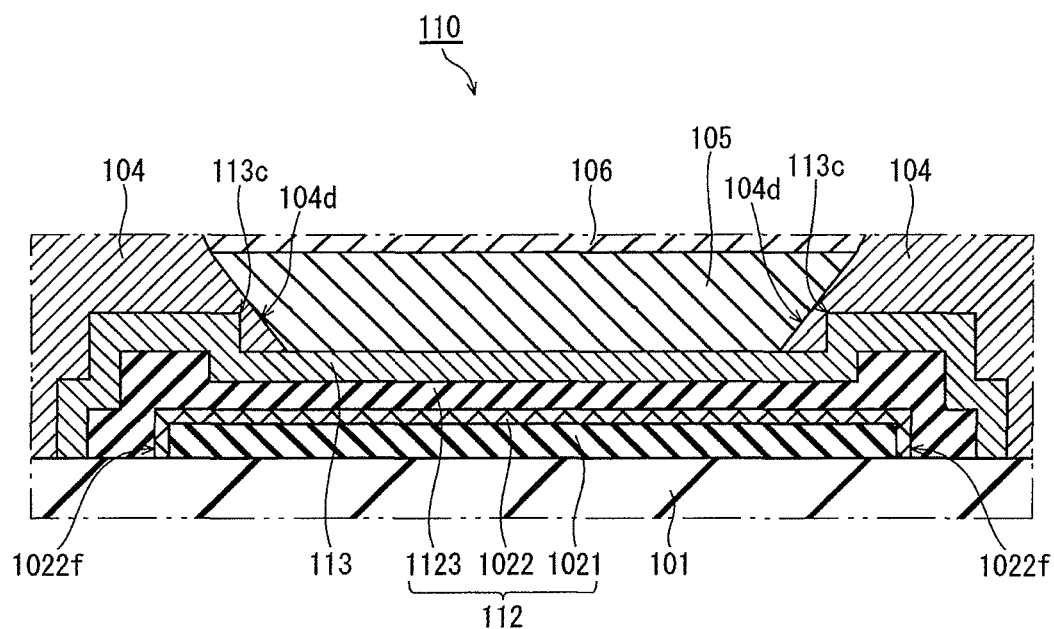
FIG. 9 is an end elevation that shows an enlarged main part of an organic EL element 110 pertaining to a second embodiment.

The following describes a structure of an organic EL element 110 pertaining to a second embodiment, with reference to FIG. 9. Note that elements of the organic EL elements 100*a*, 100*b* and 100*c* that are the same as the elements thereof in the first embodiment have the same reference numerals in FIG. 9, and descriptions thereof are omitted.

As shown in FIG. 9, the organic EL element 110 pertaining to the present embodiment is different from each of the organic EL elements 100*a*, 100*b* and 100*c* in the first embodiment in a form of an anode metal layer 1123 of an anode 112 and a form of a hole injection transport layer 113 formed on the anode metal layer 1123. Specifically, in the organic El element 110, the anode metal layer 1123 is formed so as to cover side surfaces 1022*f* of the ITO layer 1022, and bottom surfaces of end portions of the hole injection transport layer 113 are in contact with the principal surface of the substrate 101.

Note that, in the organic EL element 110 pertaining to the present embodiment, a surface portion of the metal layer is oxidized so as to be a metal oxide layer (upper layer). This metal oxide layer is the hole injection transport layer 113, and the remaining portion of the metal layer (lower layer) is the anode metal layer 1123 of the hole injection transport layer 113. Materials used for forming the anode metal layer 1123 and the hole injection transport layer 113 and a method of manufacturing these are basically the same as the first embodiment.

Also, the organic EL element 110 pertaining to the present embodiment also has a recess. The recess is formed by partially depressing an upper surface portion of the hole-transport/injection layer 113. Also, a peripheral edge 113*c* of the recess is covered with the covering part 104*d* of the bank 104. Therefore, the organic EL element 110 pertaining to the present embodiment has exactly the same advantages as those possessed by each of the organic EL elements 100*a*, 100*b* and 100*c* pertaining to the first embodiment.

Third Embodiment

Figure 10:
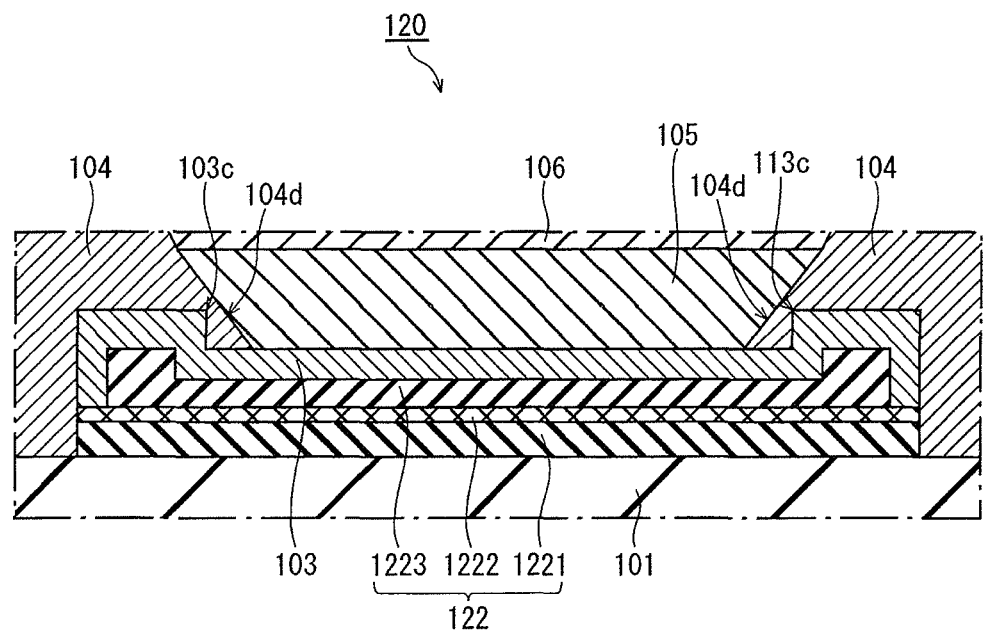
FIG. 10 is an end elevation that shows an enlarged main part of an organic EL element 120 pertaining to a third embodiment.

A description is given of a structure of an organic EL element 120 pertaining to a third embodiment, with reference to FIG. 10. Also, a description is given of characteristics of a method of manufacturing the organic EL element 120, with reference to FIGS. 11A, 11B and 11C. Elements that are the same as elements of the organic EL elements 100*a*, 100*b* and 100*c* pertaining to the first embodiment have the same reference numerals in FIG. 10 and FIGS. 11A, 11B and 11C. Therefore, the descriptions thereof are omitted.

As shown in FIG. 10, the organic EL element 120 pertaining to the present embodiment is different from the organic EL elements 100*a*, 100*b* and 100*c* pertaining to the first embodiment in a form of an anode 122. Specifically, in the present embodiment, an anode base layer 1221 of the anode 122 and an ITO layer 1222 that is layered on the anode base layer 1221 have the same width as the hole injection transport layer 103.

The organic EL element 120 pertaining to the present embodiment is the same in other structures as each of the organic EL elements 100*a*, 100*b* and 100*c* pertaining to the first embodiment.

Figure 11A:
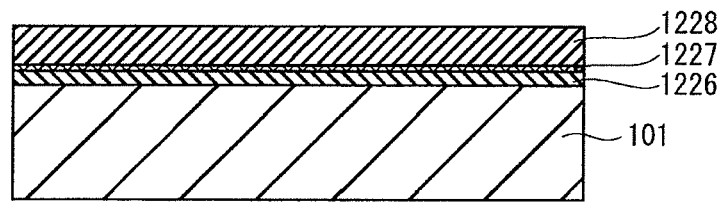
FIGS. 11A, 11B, and 11C are end elevations that each schematically show part of the process in manufacturing the organic El element 120 pertaining to the third embodiment.
Figure 11B:
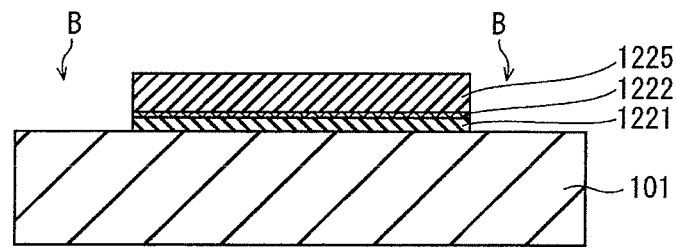
Figure 11C:
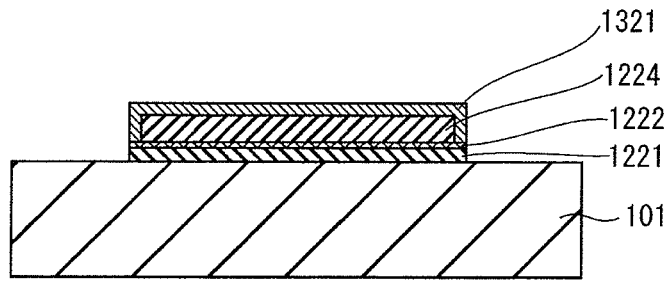

Processes shown in FIG. 11A to FIG. 11C correspond to the above-described processes in the first embodiment shown in FIG. 6A to 6C, respectively. As shown in FIG. 11A, according to the method of manufacturing the organic EL element 120 pertaining to the present embodiment, a metal layer 1226, an ITO layer 1227 and a metal layer 1228 are layered on an upper principal surface of the substrate 101 in the stated order. The metal layer 1226 and the metal layer 1228 are respectively formed with use of the same material as the materials that are used for forming the anode base layer 1021 and the metal layer 1025 in the first embodiment.

Next, as shown in FIG. 11B, the metal layer 1226, the ITO layer 1227 and the metal layer 1228 are collectively etched in each area in which the organic EL element 120 is to be formed. Thus, the anode base layer 1221, the ITO layer 1222 and the metal layer 1225 are layered on the substrate 101 in the stated order.

Next, as shown in FIG. 11C, a surface portion of the metal layer 1228 is naturally oxidized, and the oxidized surface portion of the metal layer 1228 becomes a metal oxide layer 1321. A metal layer 1224 (the remaining lower portion of the metal layer 1228) becomes a base of the anode metal layer 1223 as with the metal layer 1024 shown in FIG. 6C.

Although the subsequent processes are not depicted, the organic EL element 120 is formed by performing the same processes as described with use of FIG. 5 and FIGS. 6A, 6B and 6C in the first embodiment.

According to the organic EL element 120 pertaining to the present embodiment, a surface portion of the metal layer is oxidized, and the oxidized surface portion of the metal layer which is metal oxide layer (upper layer) becomes the hole injection transport layer 103. The remaining portion (lower portion) of the metal layer becomes the anode metal layer 1223 of the anode 122. Materials that are used for forming the anode metal layer 1223 and the hole injection transport layer 103, and methods for manufacturing the anode metal layer 1223 and the hole injection transport layer 103 are basically the same as those in the first embodiment.

Also, according to the organic EL element 120 pertaining to the present embodiment, the hole injection transport layer 103 has a recess. The recess is formed by partially depressing the surface portion of the hole injection transport layer 103. The peripheral edge 103*c* of the recess is covered with the covering part 104*d* of the bank 104. Therefore, the organic EL element 120 pertaining to the present embodiment has exactly the same advantages as those possessed by each of the organic EL elements 100*a*, 100*b* and 100*c* pertaining to the first embodiment.

Fourth Embodiment

Figure 12:
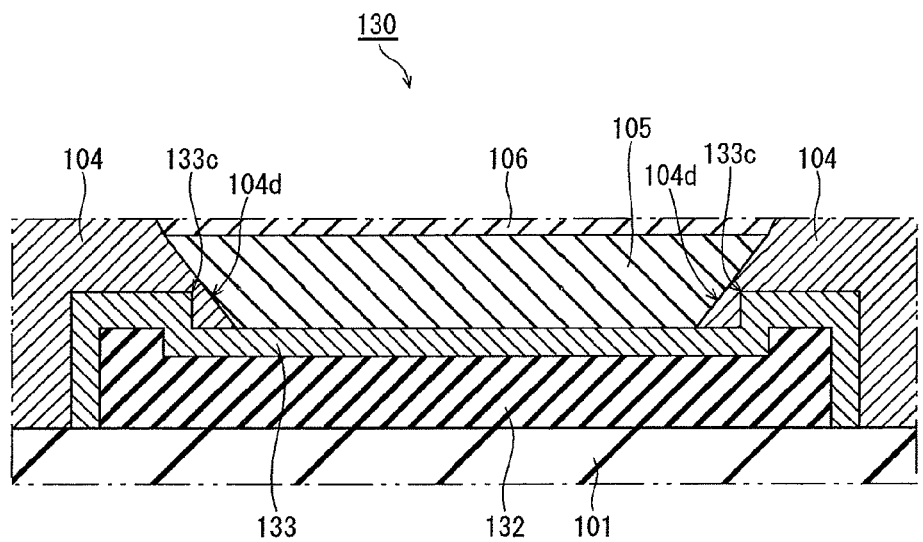
FIG. 12 is an end elevation that schematically shows a main part of an organic EL element 130 pertaining to a fourth embodiment.

The following describes an organic EL element 130 pertaining to a fourth embodiment, with reference to FIG. 12. Note that elements that are the same as the elements of each of the organic EL elements 100*a*, 100*b* and 100*c* pertaining to the first embodiment have the same reference numerals in FIG. 12, and the descriptions thereof are omitted.

As shown in FIG. 12, the organic EL element 130 pertaining to the present embodiment is different from each of the organic EL elements 100*a*, 100*b* and 100*c* pertaining to the first embodiment in that the anode 132 has a monolayer structure in the organic EL element 130 pertaining to the present embodiment. According to the organic El element 130, a metal layer (metal layer) having a monolayer structure is formed on the upper principal surface of the substrate 101. A surface portion of the metal layer is oxidized, and the oxidized portion (upper portion) becomes a hole injection transport layer 133. The remaining portion (lower portion) of the metal layer becomes an anode 132. In the organic EL element 130, the hole injection transport layer 133 has a recess under the opening of the bank 104, and a peripheral edge 133*c* of the recess is covered with the covering part 104*d* of the bank 104, as with the organic EL element 100*a*, 100*b* and 100*c*.

When the organic EL element 130 pertaining to the present embodiment has a structure in which the anode 132 has the monolayer structure, the number of layers can be further reduced. Thus, the number of manufacturing processes can be reduced compared to the organic EL elements 100*a*, 100*b* and 100*c* pertaining to the first embodiment. Therefore, the organic EL element 130 has an advantage that cost can be further reduced.

Note that the peripheral edge 133*c* of the recess included in the hole injection transport layer 133 is covered with the covering part 104d of the bank 104 as described above. Therefore, the organic EL element pertaining to the present embodiment has the same advantages as those possessed by each of the organic EL elements 100a, 100b and 100c pertaining to the first embodiment.

Fifth Embodiment

Figure 13:
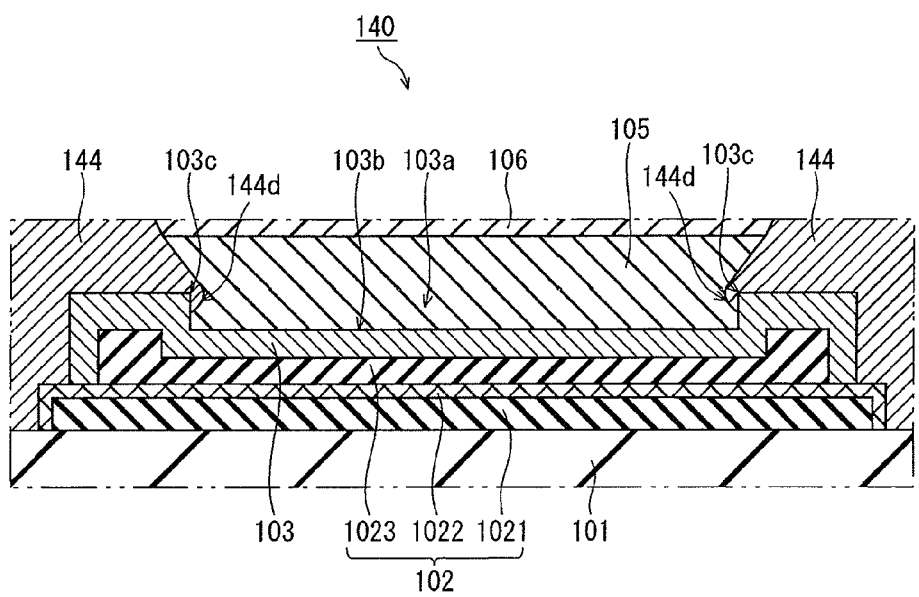
FIG. 13 is an end elevation that schematically shows a main part of an organic EL element 140 pertaining to a fifth embodiment.

The following describes a structure of an organic EL element 140 pertaining to a fifth embodiment, with reference to FIG. 13. Note that elements that are the same as the elements of each of the organic EL elements 100a, 100b and 100c have the same reference numerals in FIG. 13, and the descriptions thereof are omitted.

As shown in FIG. 13, the organic EL element 140 pertaining to the present embodiment is different from each of the organic EL elements 100a, 100b and 100c pertaining to the first embodiment in a form of a covering part 144d of the bank 144. Specifically, according to the organic EL elements 100a, 100b and 100c pertaining to the first embodiment, the covering part 104d of the bank 104 reaches the base 103b over the peripheral edge 103c included in the hole injection transport layer 103. However, according to the organic EL element 140 pertaining to the present embodiment, the covering part 144d of the bank 144 covers the peripheral edge 103c of the recess as with the covering part 104d pertaining to the first embodiment. However, the covering part 144d of the bank 144 does not reach the base 103b of the recess included in the hole injection transport layer 103. With such a structure, the bank material does not have to be extended to the base 103b of the recess included in the hole injection transport layer 103. Therefore, it is possible to keep a temperature for the heat treatment low and to shorten time necessary for the heat treatment.

Note that the peripheral edge 103c of the recess included in the hole injection transport layer 103 is covered with the covering part 144d of the bank 144, as described above, in the organic EL element pertaining to the present embodiment. Therefore, the organic EL element pertaining to the present embodiment has the same advantages as those possessed by each of the organic EL elements 100a, 100b and 100c pertaining to the first embodiment.

Other Considerations

Figure 14A:
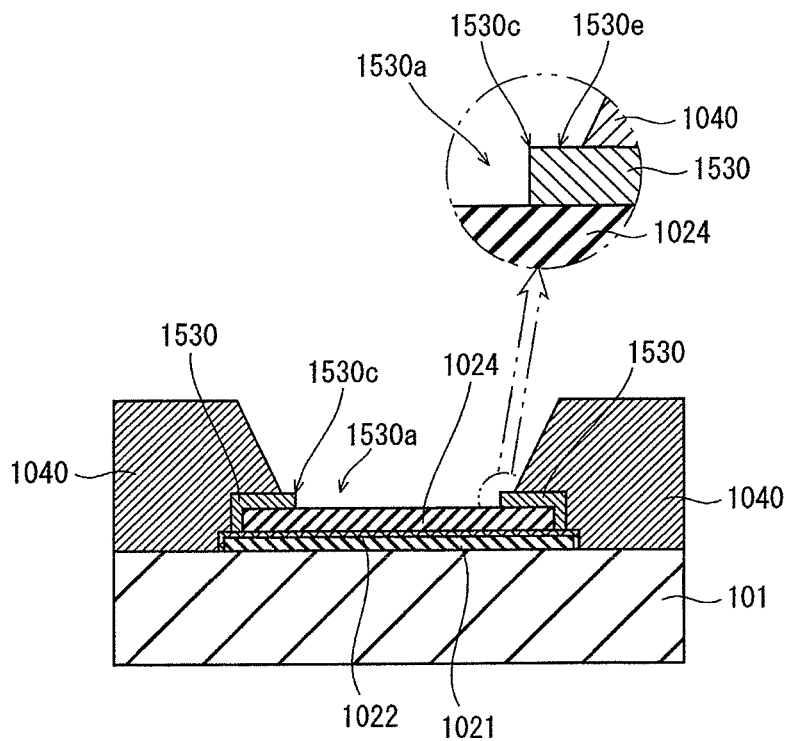
FIGS. 14A and 14B each are an end elevation that schematically shows part of the process in manufacturing an organic El element pertaining to a modification.
Figure 14B:
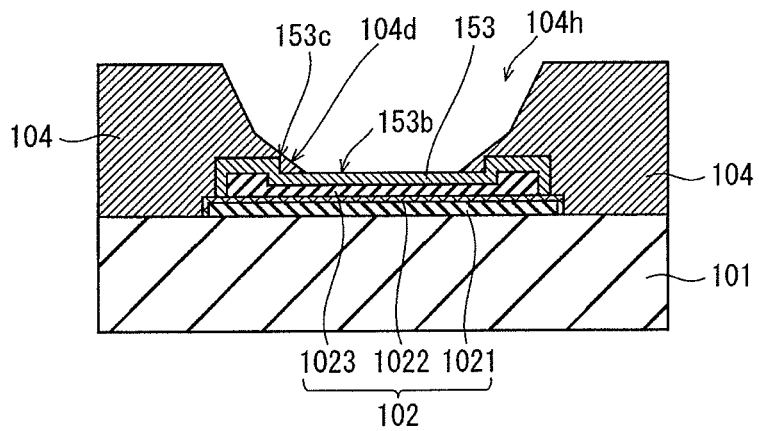

In the above-described first to fifth embodiments, an explanatory structure is adopted in which a lower end of each inner side wall of the bank preparation layer 1040 is flush with the peripheral edge 103c of the recess included in the metal oxide layer 1030 as shown in FIG. 7A. However, the present invention does not necessarily have to have this structure. The following explanatory case as shown in FIG. 14A is also possible. The lower end of each inner side wall of the bank preparation layer 1040 may be positioned further from the recess than a peripheral edge 1530c of a recess 1530a included in a metal oxide layer 1530. Thus, an area 1530e of a portion of the metal oxide layer 1530 that is not depressed (see a part of FIG. 14A enclosed by a two-dot chain line) is exposed.

In other words, the peripheral edge 1530c is defined by an angle formed between a portion of the upper surface of the metal oxide layer 1530 on which the recess is not formed and each side wall of the recess 1530a.

Even with the above-described structure, the same advantages possessed by each of the organic EL elements 100a, 100b and 100c pertaining to the first embodiment (advantages obtained by the covering portion 104d included in the bank 104) can be obtained by the following. The bank preparation layer 1040 is thermally treated so that the peripheral edge 1530c of the recess 1530a is covered with a portion of the bank 104.

Figure 18:
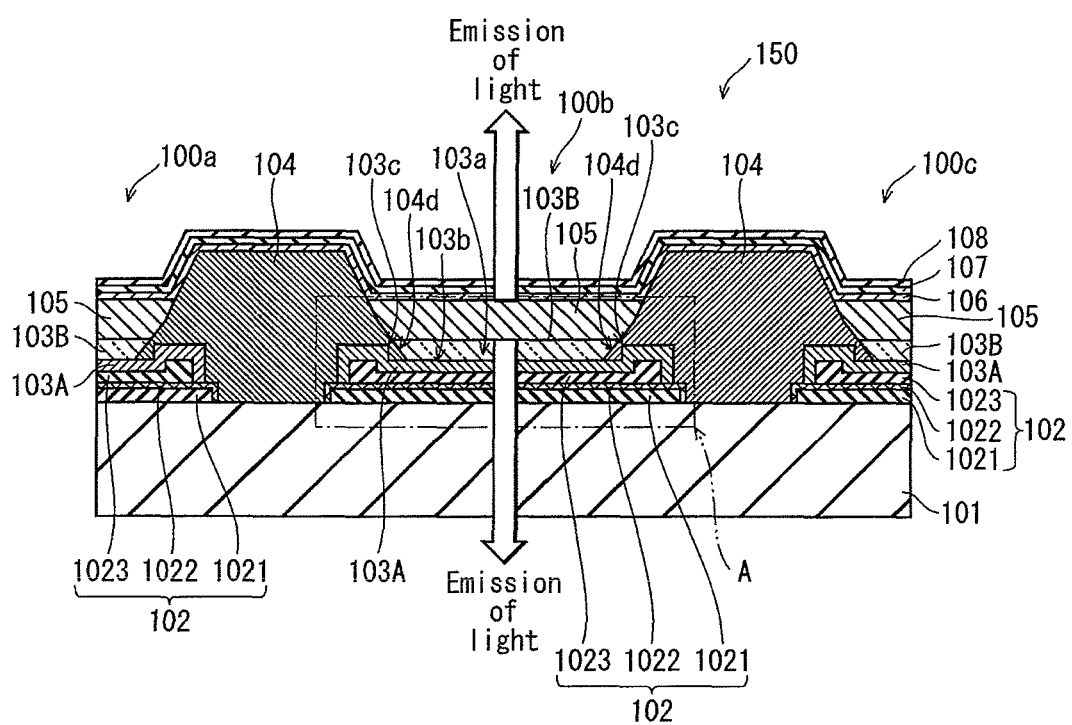
FIG. 18 is an end elevation that shows a main part of an organic EL element 150 pertaining to a sixth embodiment.

In the above-described first to fifth embodiments, the hole injection transport layer as a charge-injection/transport layer is interposed between the first electrode and the light-emitting layer. However, such a structure is not essential. The hole injection and the hole transport layer included in the functional layer may be interposed between the first electrode and the light-emitting layer. Specifically, as shown in the part A of the organic EL element 150 pertaining to a sixth embodiment, which is depicted in FIG. 18, a hole transport layer 103B may be formed on the recess 103a in the hole injection layer 103A by applying ink containing hole transport material to the recess 103a under the condition that the peripheral edge 103c of the recess 103a in the hole-injection layer 103A is covered with the covering part 104d of the bank 104, and the light-emitting layer 105 may be formed on the hole transport layer 103B by applying ink containing light-emitting material to the hole transport layer 103B.

In the above-described first to fifth embodiments, a high-molecule organic material is used for forming the organic light-emitting layer 105 as an example. However, the same advantages as those possessed by the first to fifth embodiments can be obtained even when a low-molecule organic material is used for forming the organic light-emitting layer 105.

Also, it is assumed that the organic EL elements 100a, 100b, 100c, 110, 120, 130, 140 and 150 pertaining to the above-described first to sixth embodiments are used in the display panel 10. However, when the organic EL elements are used in a lighting device that performs a surface light emitting, for example, the electrodes 102, 112, 122 and 132 may be uniformly formed on a whole surface or a most of the surface of the substrate 101.

Alternatively, these electrodes 102, 112, 122 and 132 may be patterned so that a specific geometric figure or a specific character may be displayed. In this case, since characteristically-patterned light can be emitted, organic EL elements having such a structure may be used for displaying advertisements.

Note that the above-described hole injection transport layers 103, 113, 133 and 153 may be provided as the hole-injection layer, the hole-transport layer or the hole injection transport layer.

Also, in the above-described first to third and fifth embodiments, the anode base layers 1021 and 1221 of the anodes 102, 112, 122 and 132 are formed with use of the Ag thin film. Also, the ITO layers 1022 and 1222 are respectively formed on the anode base layers 1021 and 1221. Alternatively, the anode base layers 1021 and 1221 of the anodes 102, 112, 122 and 132 may be formed with use of an alumina material. In both of these cases, the ITO layers may be omitted.

Also, in the above-described first to fifth embodiments, an explanatory structure is adopted in which the so-called pixel bank (bank having a lattice-shaped plane surface) is used (see FIG. 4). However, speaking of the plane view of each of the banks 104 and 144, a line bank, for example, may be used as each of the banks 104 and 144. The following describes supplemental explanations on the plane view of the line bank with use of FIG. 15.

Figure 15:
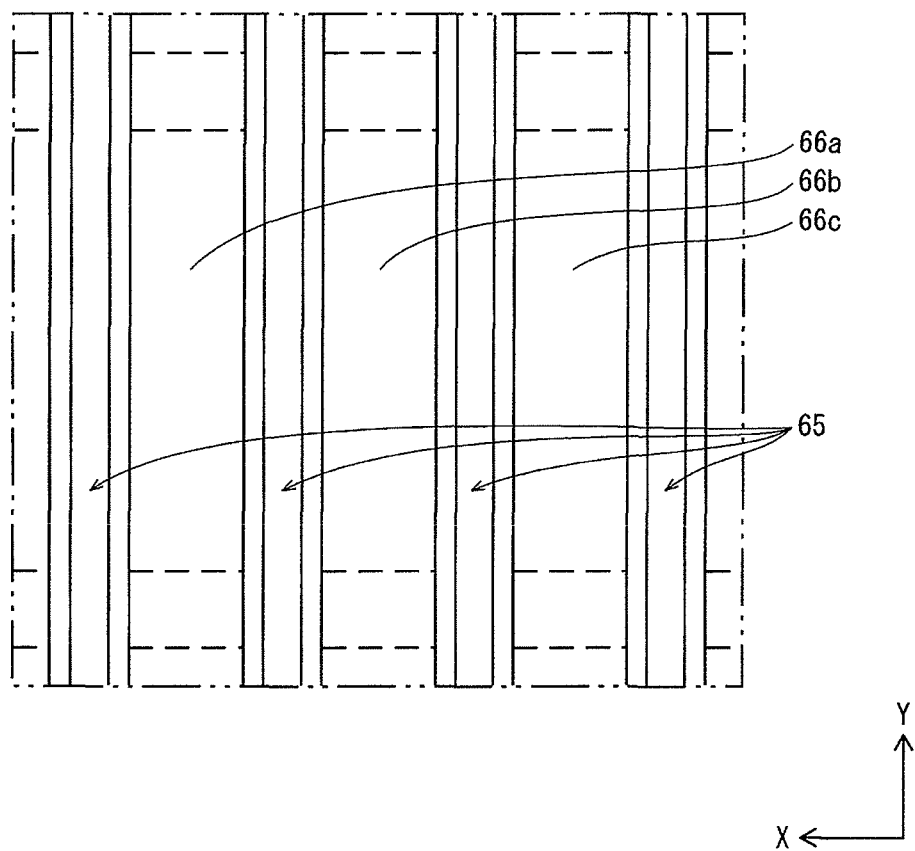
FIG. 15 is a schematic plane view showing a form of a line bank 65 pertaining to the modification.

As shown in FIG. 15, when banks arranged in lines (line bank) 65 are adopted, organic light-emitting layers 66a, 66b and 66c that are arranged consecutively in an X direction are delimited.

Note that when the line banks 65 are adopted, organic light-emitting elements that are arranged consecutively in a Y direction are not defined by bank elements. However, the organic light-emitting elements can emit light without affecting one another by appropriately setting the drive method, a size of anodes and a distance between the anodes, for example.

Also, in the above-described first to sixth embodiments, the explanatory structure is adopted in which only the electron-injection layer 106 is provided between the organic light-emitting layer 105 and the cathode 107. However, a structure may be adopted in which the electron-transport layer is provided between the organic light-emitting layer 105 and the cathode 107 in addition to the electron-injection layer 106.

Furthermore, in the above-described first to fifth embodiments, the surface portion of the metal layer is oxidized, and the oxidized surface portion of the metal layer is each of the hole injection transport layer 103, 113 and 133. However, when a structure is adopted in which the cathode is arranged under each of the banks 104 and 144, the oxidized surface portion may be the electron-injection layer, the electron-transport layer or the electron-injection/transport layer.

Figure 16:
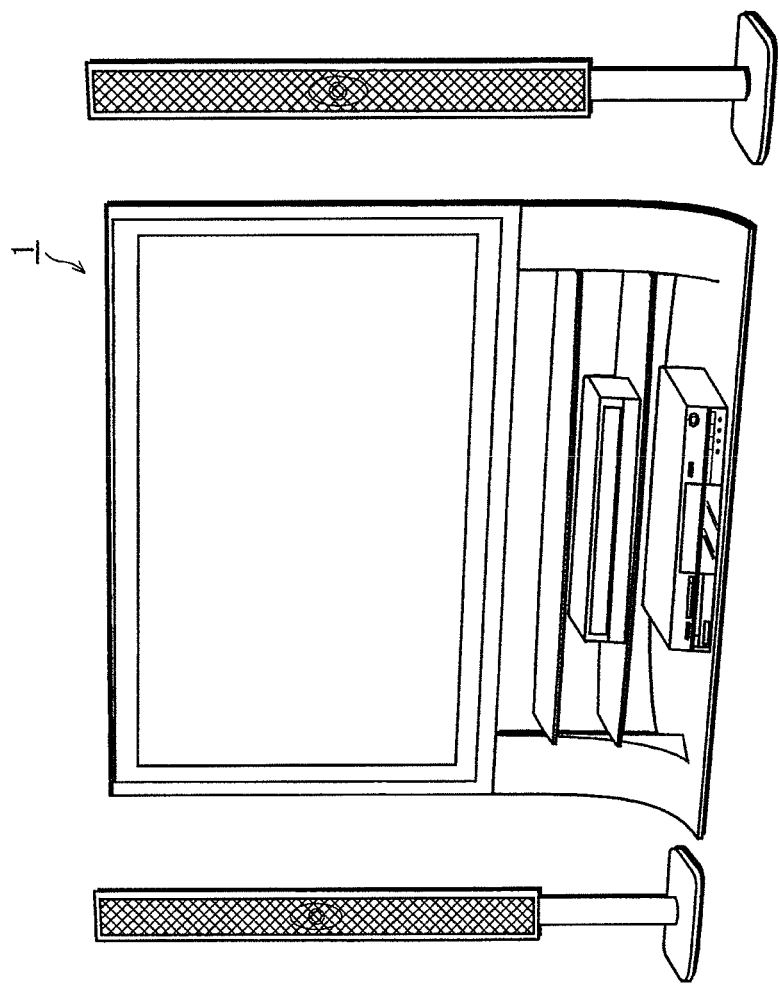
FIG. 16 is a perspective view showing an aspect of the display device 1.

Also, although an aspect of the display device 1 is not shown in the above-described first to fifth embodiments, the display device may have an aspect as shown in FIG. 16. The display device 1 displays images on both sides thereof.

INDUSTRIAL APPLICABILITY

The present disclosure is useful for realizing organic EL elements that are suitable for use in a display device, a lighting device, etc.

REFERENCE SIGNS LIST 1 display device
10 display panel
20 drive control unit
21-24 drive circuit
25 control circuit
65 line bank
100a-100c, 110, 120, 130, 140 organic EL element
101, 211 TFT substrate
102, 112, 122, 132 anode
103, 113, 133, 153 hole injection transport layer
103A hole injection layer
103B hole transport layer
104, 144 bank
105, 56a1, 56a2, 56b1, 56b2, 56c1, 56c2, 66a, 66b, 66c organic light-emitting layer
106 electron injection layer
107, 271 cathode
108 passivation layer
1021, 1221 anode base layer
1022, 1222, 1227 ITO layer
1023, 1123, 1223 anode metal layer
1024, 1025, 1224, 1225, 1226, 1228 metal layer
1030, 1031, 1321 metal oxide layer

The invention claimed is:

1. A double-sided light-emitter that emits light from both sides thereof, comprising:
  a first electrode;
  a layered body disposed on the first electrode, the layered body including a charge injection layer and a functional layer, the functional layer including a light-emitting layer;
  a second electrode disposed on the layered body; and
  a bank that defines a position of the light-emitting layer, wherein
  the first electrode and the second electrode are transparent electrodes,
  the charge injection layer is formed by oxidation of an upper portion of a metal,
  the first electrode includes a metal layer that is a lower portion of the metal,
  an inner portion of the charge injection layer is depressed to define a recess,
  an upper peripheral edge of the recess is covered with a portion of the bank,
  a portion of the light-emitting layer is interposed between the second electrode and the upper peripheral edge of the recess,
  the portion of the light-emitting layer is interposed between the second electrode and the portion of the bank, and undergoes charge injection from the second electrode, and
  the portion of the bank is interposed between the upper peripheral edge of the recess and the part of the light-emitting layer.

2. The light emitter of claim 1, wherein
the charge injection layer is a hole injection layer made from one of a metal oxide, a metal nitride, and a metal oxynitride.

3. The light-emitter of claim 2, wherein
the functional layer includes a hole transport layer that transports holes from the hole injection layer to the light-emitting layer, and
the hole transport layer is interposed between the hole injection layer and the light-emitting layer.

4. The light-emitter of claim 1, wherein
the first electrode is a laminate including a semi-transparent or transparent metal thin film,
the metal thin film contains any material selected from the group consisting of Ag, Mg, Al, Pt, Pd, Au, Ni, Ir and Cr, and has a thickness falling within a range of 3 nm to 30 nm.

5. The light-emitter of claim 1, wherein
the second electrode is made from ITO or IZO.

6. The light-emitter of claim 5, wherein
the second electrode is a laminate including a semi-transparent or transparent metal thin film.

7. The light-emitter of claim 6, wherein
the metal thin film contains any material selected from the group consisting of Ag, Mg, Al, Pt, Pd, Au, Ni, Ir and Cr, and has a thickness falling within a range of 3 nm to 30 nm.

8. The light-emitter of claim 1, wherein
the bank is formed by a solution, and
the solution is erosive to the charge injection layer formed by oxidation of the upper portion of the metal.

9. The light-emitter of claim 1, wherein
the portion of the bank that is on the outer portion of the charge injection layer is adjacent to the recess, and
an inner side wall of the bank slopes upwardly with respect to a bottom surface of the recess.

10. The light-emitter of claim 1, wherein
the portion of the bank that is on the outer portion of the charge injection layer is displaced from a bottom surface of the recess.

11. The light-emitter of claim 1, wherein
the light-emitting layer is an organic EL layer.

12. The light-emitter of claim 1, wherein
the outer portion of the charge injection layer protrudes along a base of the bank.

13. The light-emitter of claim 1, wherein
the portion of the bank that is on the outer portion of the charge injection layer is defined by an angle formed between two surfaces, one of the two surfaces being a top surface of the outer portion of the charge injection layer and the other of the two surfaces being a side wall of the bank.

14. The light-emitter of claim 1, wherein
the second electrode is a cathode,
the layered body includes an electron transport layer interposed between the light-emitting layer and the second electrode,
electrons injected from the second electrode are transported to the functional layer including the light-emitting layer via the electron transport layer.

15. A light-emitting device including a plurality of the light-emitter of claim 1.

* * * * *